(12) United States Patent
Ogino et al.

(10) Patent No.: US 7,500,219 B2
(45) Date of Patent: Mar. 3, 2009

(54) EXPOSURE DATA GENERATOR AND METHOD THEREOF

(75) Inventors: Kozo Ogino, Kawasaki (JP); Hiromi Hoshino, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 335 days.

(21) Appl. No.: 11/237,658

(22) Filed: Sep. 29, 2005

(65) Prior Publication Data
US 2006/0195815 A1 Aug. 31, 2006

(30) Foreign Application Priority Data
Feb. 25, 2005 (JP) .............. 2005-051771

(51) Int. Cl.
*G06F 17/50* (2006.01)
(52) U.S. Cl. .............. 716/21; 716/19; 716/20; 430/5; 430/30
(58) Field of Classification Search ............. 716/19–21; 430/5, 30; 703/5, 30
See application file for complete search history.

(56) References Cited

U.S. PATENT DOCUMENTS 5,667,923 A * 9/1997 Kanata .................. 430/30
6,243,487 B1 * 6/2001 Nakajima ................. 382/144
6,845,497 B2 * 1/2005 Murai et al. ................ 716/20
7,205,078 B2 * 4/2007 Osawa et al. ............... 430/30

FOREIGN PATENT DOCUMENTS

JP  2001-052999  2/2001
JP  2002-313693  10/2002

OTHER PUBLICATIONS

F. Murai et al. "Fast proximity effect correcton method using a pattern area density map", J. Vac. Science Technology, vol. 10, No. 6, 1992, pp. 3072-3076.

* cited by examiner

*Primary Examiner*—Jack Chiang
*Assistant Examiner*—Nghia M Doan
(74) *Attorney, Agent, or Firm*—Staas & Halsey LLP

(57) ABSTRACT

A plurality of patterns placed within an target region are classified by their placement positions, a pattern adjacent to each side of each pattern is searched for by using the classification results, and adjacent pattern information is obtained. Next, a back-scattering intensity at an evaluation point on a pattern is calculated, a movement quantity of the side is calculated so that the sum of a forward-scattering intensity and the back-scattering intensity at the evaluation point becomes a reference exposure intensity by using the adjacent pattern information and the back-scattering intensity, and the pattern is then corrected.

1 Claim, 26 Drawing Sheets

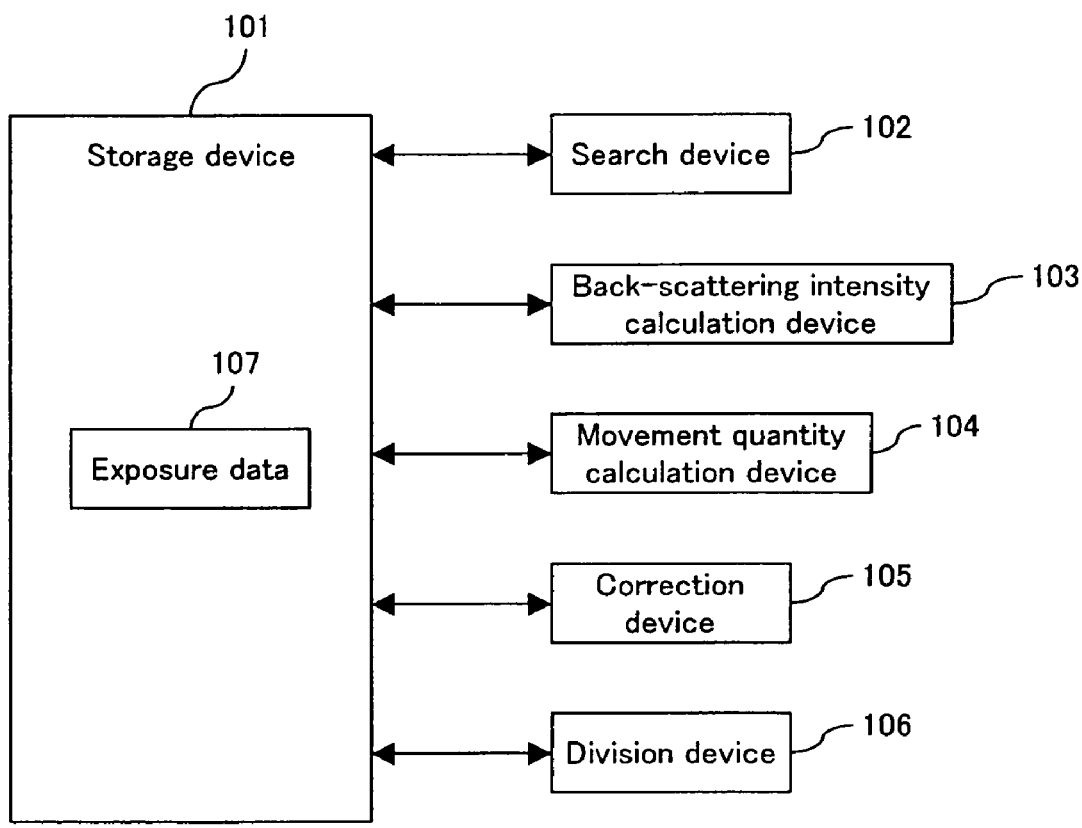
F I G. 1

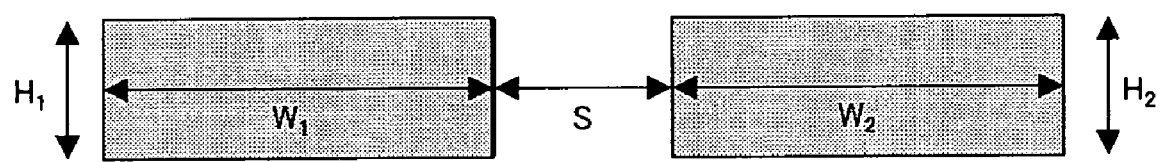
F I G. 8

| Number of patterns | Number of layers (N) |
|---|---|
| 4 or less | 1 |
| 16 or less | 2 |
| 64 or less | 3 |
| 256 or less | 4 |
| 1024 or less | 5 |
| 4096 or less | 6 |
| 4097 or more | 7 |

FIG. 13

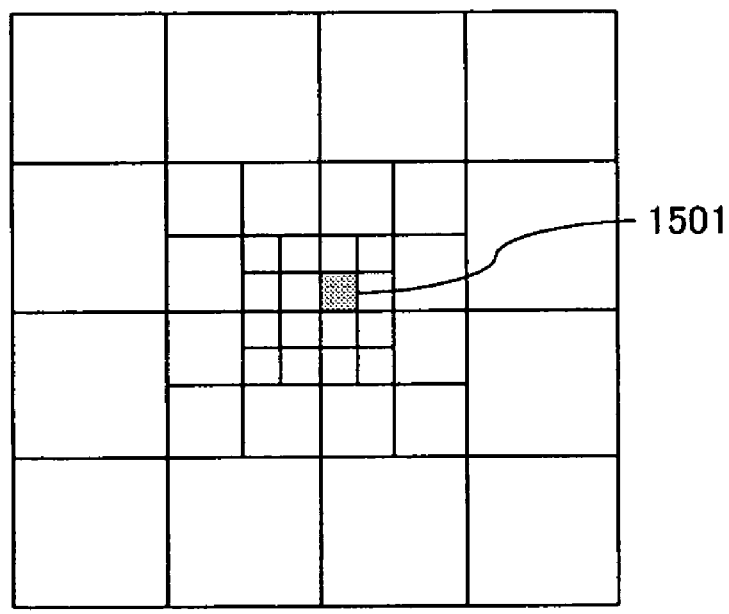
F I G. 15

EXPOSURE DATA GENERATOR AND METHOD THEREOF

CROSS REFERENCE TO RELATED APPLICATIONS

This application is based upon and claims the benefit of priority from the prior Japanese Patent Application No. 2005-051771, filed on Feb. 25, 2005, the entire contents of which are incorporated herein by this reference.

BACKGROUND OF THE INVENTION

1. Field of the Invention

The present invention relates to exposure by charged particle beam in the manufacturing process of a semiconductor device and a generator for generating exposure data to manufacture exposure masks or reticles and a method thereof.

2. Description of the Related Art

In recent years, because required pattern sizes have become miniaturized with the improvement of semiconductor device accumulation, sufficient resolution cannot be obtained through conventional exposure methods, and the formation of miniaturized patterns has become difficult. Therefore, exposure methods employing charged particle beam, electron beam in particular, are being currently used.

As electron beam exposure methods, there are: the point beam exposure method wherein resolution is high, but throughput low; the variable forming exposure method wherein throughput is improved by exposing pattern in small rectangular units; the segment one-shot exposure method wherein patterns repeatedly appearing within a chip are collectively lithographed by using a stencil mask; and the projection-type exposure method wherein the masks for all patterns are created and a large area is collectively lithographed, as in exposure by light. Because the shot number of electron beams can be reduced in the segment one-shot exposure method and the projection-type exposure method, throughput can be improved.

When a circuit pattern is plotted by radiating an electron beam onto a substrate resist film, the electron beam is radiated only onto the area of the pattern to be plotted. At this time, the electron incident on the resist film is partially forward-scattered, and the electron beam which permeates the resist film is partially back-scattered and is again incident on the resist film. Therefore, its influence propagates even if the electron beam is incident on one point on the resist film, thereby causing the generation of a so-called proximity effect.

As the energy intensity distribution (EID) function f(x, y) of the resist film when the electron beam is incident on one point on the resist film, the following formula wherein the term of forward-scattering and the term of back-scattering are each approximated by Gaussian distribution function is implemented:

$$f(x, y) = \frac{1}{\pi(1+\eta)} \left\{ \frac{1}{\beta_f^2} \exp\left(-\frac{x^2+y^2}{\beta_f^2}\right) + \frac{\eta}{\beta_b^2} \exp\left(-\frac{x^2+y^2}{\beta_b^2}\right) \right\} \quad (1)$$

Here, $\beta_f$ is the forward-scattering length, $\eta$ is the back-scattering ratio, and $\beta_b$ is the back-scattering length. In addition, the first term in Formula (1) is called the forward-scattering term, and the second term thereof is called the back-scattering term. Forward-scattering has great influence on a narrow range, and back-scattering has a relatively small influence to a broad range. The ratio of these influences is $\eta$. These values are dependent on the energy of the electron beam, the thickness of the resist film, and the material of the substrate or the like, and are determined through experiments. The higher the acceleration voltage of the electron beam becomes, the smaller $\beta_f$ and the larger $\beta_b$ becomes. For example, if acceleration voltage is 100 kV and resist film thickness is 200 nm, $\beta_f$ is approximately 7 nm and $\beta_b$ is approximately 30 μm.

As correction methods for proximity effect in conventional exposure data generation, a simple and high-speed method which focuses attention on the differences between the influence ranges of forward-scattering and back-scattering is known (for example, refer to Patent References 1 and 2, below). In this method, the dimensions of pattern figures contained in exposure data are changed, taking into account the influence of proximity effect.

In instances of high acceleration voltage, it is unnecessary to consider the influence of forward-scattering from adjacent patterns because the influence range of forward-scattering is very narrow, and in addition, the influence of back-scattering can be approximated by small area units because the influence range of back-scattering is very broad. In Patent References 1 and 2, an area density map method is used as the approximation method for the latter.

The area density map method is a method wherein, as described in the following Non-Patent Reference 1, effectual area density is determined for each correction calculation mesh region by dividing exposure data into the correction calculation mesh regions, determining pattern area density within each correction calculation mesh region, and smoothing the area density according to the contribution of back-scattering. Here, pattern area density refers to the percentage of pattern area within one correction calculation mesh region to the entire area of the region.

Patent Reference 1: Japanese Patent Application Publication No. 2001-052999
Patent Reference 2: Japanese Patent Application Publication No. 2002-313693
Non-Patent Reference 1: F. Murai et al., "Fast proximity effect correction method using a pattern area density map", J. Vac. Sci. Technol. B, Vol. 10, No. 6, pp. 3072-3076 (1992)

However, the afore-mentioned conventional exposure data generation methods have the following problems:

In a high acceleration voltage projection-type exposure method, the effectual influence of forward-scattering spreads due to blurring of the beam caused by aberration or coulomb effect. In particular, if current intensity is increased to improve throughput, the blurring of the beam is increased. Therefore, even in a high acceleration voltage exposure device, the overlapping of forward-scatterings from adjacent patterns is becoming difficult to ignore. In addition, in a low acceleration voltage exposure method, forward-scatterings are prone to overlap because the spreading of forward-scattering is relatively wide. Thus, although it is becoming vital to take into account the overlapping of forward-scattering, the problem lies in that search for adjacent patterns takes time.

Furthermore, if back-scattering intensity distribution is calculated by area density map method, the influence of back-scattering from patterns in the vicinity is also approximated. Therefore, if the patterns become increasingly miniaturized, errors caused by the approximation will become difficult to ignore.

In addition, if heavy metals such as copper and tungsten are present in the lower layer, as in multilayer wiring layers, its effect inevitably appears in the correction accuracy of exposure data as calculation errors when the correction calculation mesh region is large, because back-scattering intensity distributions with narrow spreading are intermixed. Although, in any case, the problem may be solved if the correction calculation mesh region is minimized, in this case, high-speed performance is sacrificed because more processing time is required.

SUMMARY OF THE INVENTION

A first object of the present invention is to search for, at a high speed, the adjacent patterns within a range wherein forward-scatterings overlap to correct proximity effect taking into account the overlapping of forward-scatterings, when the exposure data for creating an exposure mask or reticle by charged particle beam is generated.

A second object of the present invention is to perform high-speed and high-accuracy calculation of the influence of back-scattering when generating the afore-mentioned exposure data.

A first exposure data generator according to the present invention comprises a storage device, a search device, a back-scattering intensity calculation device, a movement quantity calculation device and a correction device and generates exposure data showing graphical information of patterns to be exposed comprising a plurality of sides.

The storage device stores pre-correction exposure data which includes information on the positions and sizes of a plurality of patterns placed within the target region. The search device classifies these patterns according to the placement positions within the target region, searches for a first pattern adjacent to a side of a second pattern by using the classified patterns, and stores information on the first and second patterns to the storage device. The back-scattering intensity calculation device calculates the back-scattering intensity from the afore-mentioned plurality of patterns at an evaluation point on the second pattern. The movement quantity calculation device calculates the movement quantity of the side of the second pattern, when the side of the second pattern is moved, by using the information on the first and second patterns and the calculated back-scattering intensity, so that the sum of the forward-scattering intensity from the first pattern, the forward-scattering intensity from the second pattern, and the back-scattering intensity at the evaluation point becomes the reference exposure intensity. The correction device moves the side of the second pattern by the obtained movement quantity and corrects the information on the second pattern.

A second exposure data generator according to the present invention comprises a storage device, a back-scattering intensity calculation device, a movement quantity calculation device, a correction device, and a division device and generates exposure data showing graphical information of the patterns to be exposed comprising a plurality of sides.

The storage device stores the pre-correction exposure data which includes the positions and sizes of a plurality of patterns placed within the target region. The division device hierarchically divides the target region so that each sub-region in the n-th layer is divided into a plurality of sub-regions in the (n+1)-th layer with the target region as a sub-region in the first layer and stores information on the sub-regions in each layer and information on the patterns contained in each sub-region in the lowest layer to the storage device. The back-scattering intensity calculation device obtains the back-scattering intensity from the plurality of patterns at an evaluation point on a first pattern by calculating the back-scattering intensity from a second pattern which is relatively distant from the evaluation point, by using back-scattering intensity from a sub-region in a relatively higher layer which contains the second pattern, and calculating the back-scattering intensity from a third pattern which is relatively closer to the evaluation point, by using the back-scattering intensity from a sub-region in a relatively lower layer which contains the third pattern. The movement quantity calculation device calculates the movement quantity of the side of the first pattern so that the sum of the forward scattering intensity and the back-scattering intensity from the plurality of patterns at the evaluation point becomes the reference exposure intensity, when the side of the first pattern is moved. The correction device moves the side of the first pattern by the obtained movement quantity and corrects the information on the first pattern.

BRIEF DESCRIPTION OF THE DRAWINGS

FIG. 1 is a principle diagram showing an exposure data generator according to the present invention;

FIG. 8 is a diagram showing third adjacent patterns;

FIG. 13 is a diagram showing a layer number table;

FIG. 15 is a diagram showing an example of a pattern to be used to calculate the back-scattering intensity at an evaluation point;

DESCRIPTION OF THE PREFERRED EMBODIMENTS

Figure 2:
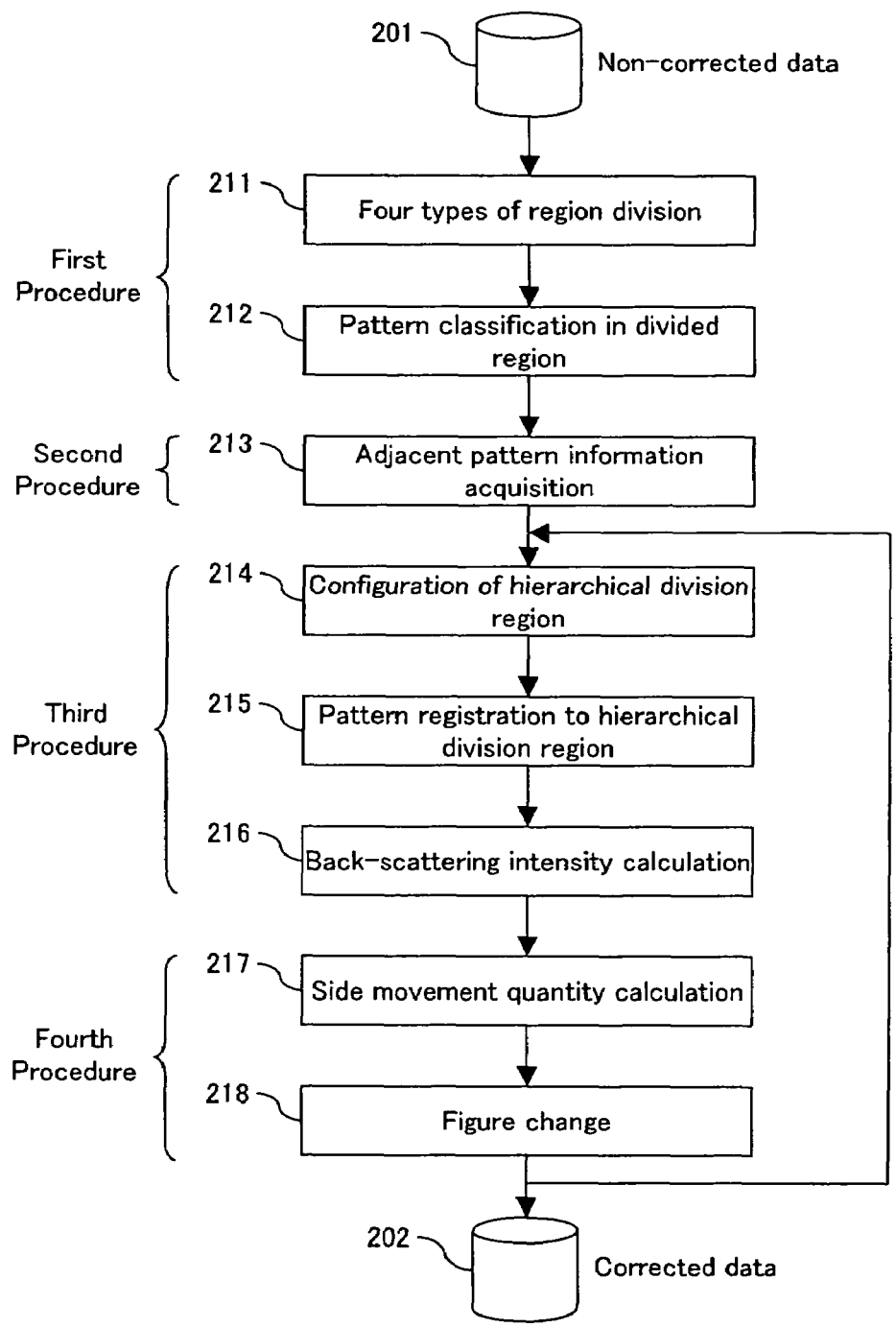
FIG. 2 is a flowchart of a first exposure data correction processing.

Described in detail, below, are the preferred embodiments according to the present invention with reference to the drawings.

FIG. 1 is a principle diagram of an exposure data generator according to the present invention.

A first exposure data generator according to the present invention comprises a storage device 101, a search device 102, a back-scattering intensity calculation device 103, a movement quantity calculation device 104, and a correction device 105 and generates exposure data showing the graphical information of the patterns to be exposed comprising a plurality of sides.

The storage device 101 stores pre-correction exposure data 107 which includes information on the positions and sizes of a plurality of patterns placed within a target region. The search device 102 classifies these patterns according to the placement position within the target region, searches for a first pattern adjacent to a side of a second pattern by using the classified patterns, and stores information on the first and second patterns to the storage device. The back-scattering intensity calculation device 103 calculates the back-scattering intensity from the plurality of patterns at an evaluation point on the second pattern. The movement quantity calculation device 104 calculates the movement quantity of the side of the second pattern, when the side of the second pattern is moved, by using the information on the first and second patterns and the calculated back-scattering intensity, so that the sum of the forward-scattering intensity from the first pattern, the forward-scattering intensity from the second pattern, and the back-scattering intensity at the evaluation point becomes the reference exposure intensity. The correction device 105 moves the side of the second pattern by the obtained movement quantity and corrects the information on the second pattern.

According to an exposure data generator such as this, because a plurality of patterns in the target region are classified by their placement positions, the number of the patterns which are searched when searching for the first pattern adjacent to the sides of the second pattern is limited. Therefore, the search of adjacent patterns becomes faster, and the exposure data can be efficiently corrected.

A second exposure data generator according to the present invention comprises a storage device 101, a back-scattering intensity calculation device 103, a movement quantity calculation device 104, a correction device 105, and a division device 106 and generates exposure data showing graphical information of the pattern to be exposed comprising a plurality of sides.

The storage device 101 stores pre-correction exposure data 107 which includes the positions and sizes of a plurality of patterns placed within a target region. The division device 106 hierarchically divides the target regions so that each sub-region in the n-th layer is divided into a plurality of sub-regions in the (n+1)-th layer with the target region as a sub-region in the first layer and stores information on the sub-regions in each layer and information on the patterns contained in each sub-region in the lowest layer to the storage device 101. The back-scattering intensity calculation device 103 obtains the back-scattering intensity from the plurality of patterns at the evaluation point by calculating the back-scattering intensity from a second pattern which is relatively distant from the evaluation point on the first pattern, by using the back-scattering intensity from a sub-region in a relatively higher layer which contains the second pattern, and calculates the back-scattering intensity from a third pattern which is relatively closer to the evaluation point, by using the back-scattering intensity from a sub-region in a relatively lower layer which contains the third pattern. The movement quantity calculation device 104 calculates the movement quantity of the side of the first pattern so that the sum of the forward scattering intensity and the back-scattering intensity from the plurality of patterns at the evaluation point becomes the reference exposure intensity, when the side of the first pattern is moved. The correction device 105 moves the side of the first pattern by the obtained movement quantity and corrects the information on the first pattern.

According to an exposure data generator such as this, the division of the target region becomes smaller, from the higher layer to the lower layer, influence of back-scattering from patterns in the vicinity of the evaluation point is finely approximated and calculated, and influence from farther patterns is roughly approximated and calculated. Therefore, back-scattering intensity can be obtained accurately and at a high speed, and the exposure data can be efficiently corrected.

The storage device 101 corresponds to a memory 2502 in FIG. 25 later described, for example, and the search device 102, the back-scattering intensity calculation device 103, the movement quantity calculation device 104, the correction device 105, and the division device 106 correspond to a central processing unit (CPU) 2501 in FIG. 25, for example.

According to the present invention, adjacent patterns within a range wherein forward-scatterings overlap can be searched for at a high speed when correcting exposure data for creating an exposure mask or reticle by charged particle beam.

In addition, the influence of back-scattering can be accurately calculated at a high speed when correcting exposure data.

The exposure data generator is, for example, constructed by using an information processing apparatus comprising a CPU and a memory. In addition, although the present invention is applied to exposure by charged particle beams including electron beam and ion beam, exposure by electron beam is taken as an example in the explanations below.

FIG. 2 is a flowchart of an exposure data correction processing by the exposure data generator. The exposure data generator reads non-corrected data 201 (exposure data) which includes design data for patterns to which the electron beam is radiated into the memory, executes the program for exposure data correction processing comprising first to fourth procedures, and generates corrected data 202. GDSII-type file, for example, is used as exposure data, and design data for patterns contains information of the positions and sizes (width and height) of each pattern.

In the first procedure, in order to quickly search for adjacent patterns within the range wherein forward-scatterings overlap, a plurality of non-corrected patterns within non-corrected data 201 are classified into any of segmented regions according to the placement positions thereof. In the second procedure, pattern information (width and height) and information on the pattern adjacent to respective sides are acquired for each side in each pattern using the classified patterns. In the third procedure, the back-scattering intensity of each side in each pattern is calculated, and in the fourth procedure, the movement quantity of the side is calculated from the pattern information for each side, information on the adjacent patterns, and the back-scattering intensity, and the pattern figure (shape) is changed.

Then, in order to call into account the changes in back-scattering intensity due to changing pattern shape, the third and fourth procedures are executed repeatedly and the final corrected data 202 is obtained. Described in detail, below, are the processings in each procedure.

Figure 3:
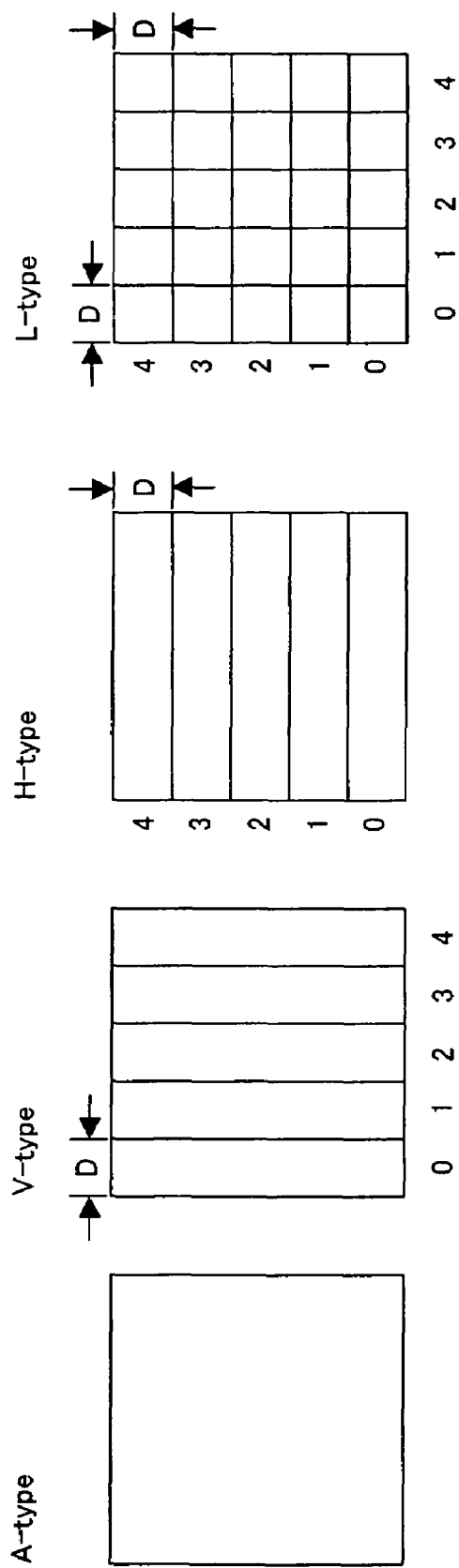
FIG. 3 is a diagram showing four types of division methods.

In the first procedure, as shown in FIG. 3, the exposure data generator divides a target region to be processed wherein a plurality of patterns are placed by the following four types of methods, with the distance between two dividing lines as D (step 211).

(1) A-Type

The same region as the original region is assumed to be sub-region A.

(2) V-Type

The original region is divided at constant distance D in the horizontal direction and a plurality of vertical stripe-type sub-regions is generated. In this example, five sub-regions, V-0 to V-4, are generated sequentially from left to right.

(3) H-Type

The original region is divided at constant distance D in the vertical direction and a plurality of horizontal stripe-type sub-regions is generated. In this example, five sub-regions, H-0 to H-4, are generated sequentially from bottom to top.

(4) L-Type

The original region is vertically and horizontally divided at constant distance D, respectively, in a lattice and a plurality of cell-type sub-regions is generated. In this example, 25 sub-regions are generated with the sub-region of i-th cell from the left and j-th cell from the bottom as L-i-j (i, j=0, 1, 2, 3, 4).

Next, each pattern within in the region to be processed is classified into the smallest sub-region which contains the pattern within, out of these sub-regions (step 212). More specifically, a sub-region wherein each pattern is contained is checked in sequential order from L-type to H-type to V-type to A-type, and the pattern is classified into the first sub-region which contains the pattern in its entirety.

Figure 4:
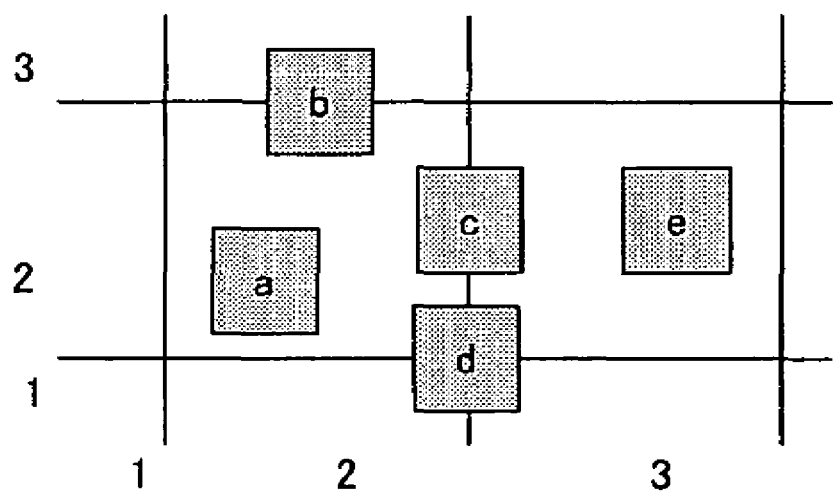
FIG. 4 is a diagram showing pattern classifications to divided sub-regions.

FIG. 4 shows pattern classification examples to the sub-regions divided by the division methods in FIG. 3. In FIG. 4, because pattern a is contained in L-type sub-region L-2-2, it is classified into this sub-region. Because pattern b spans L-type sub-regions L-2-2 and L-2-3 and is contained in V-type sub-region V-2, it is classified into V-2. Similarly, pattern c is classified into sub-region H-2, pattern d is classified into sub-region A, and pattern e is classified into sub-region L-3-2. Thus, all of the patterns are classified into one of the sub-regions.

According to classification methods such as this, it is highly possible that a small pattern is classified into an L-type sub-region, a vertically long pattern is classified into a V-type sub-region, and a horizontally long pattern is classified into an H-type sub-region. And, because a sub-region wherein an adjacent pattern is present can be easily identified from patterns thus classified, information on the adjacent pattern can be acquired at a high speed.

If V-type and H-type sub-regions do not exist, all elongated patterns such as wiring layers are classified into the A-type sub-region, and therefore, it is necessary to check almost every pattern to search for an adjacent pattern. Classification of patterns such as wiring layers into A-type can be suppressed by using V-type and H-type division methods as such.

In the second procedure, the exposure data generator searches an adjacent pattern present within the influence range of forward-scattering of each side in each classified pattern and obtains information on the pattern (step 213).

Because the sizes of each sub-region are fixed in the aforementioned division methods, the sub-region wherein an adjacent pattern for a certain pattern is present can be automatically determined.

Figure 5:
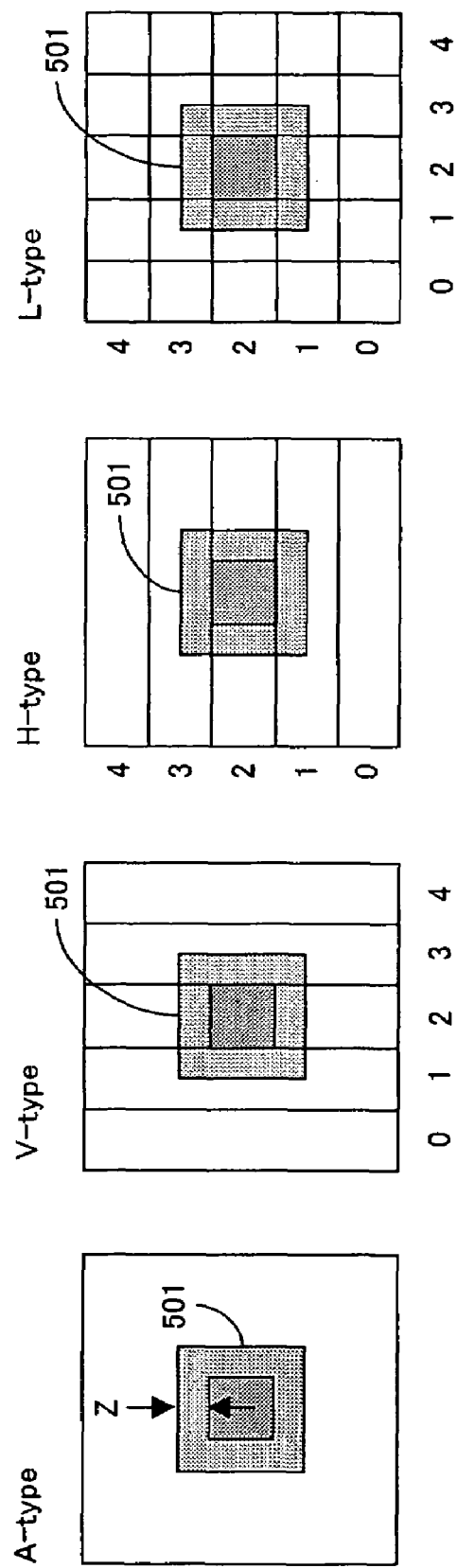
FIG. 5 is a diagram showing sub-regions where adjacent patterns are present.
Figure 6:
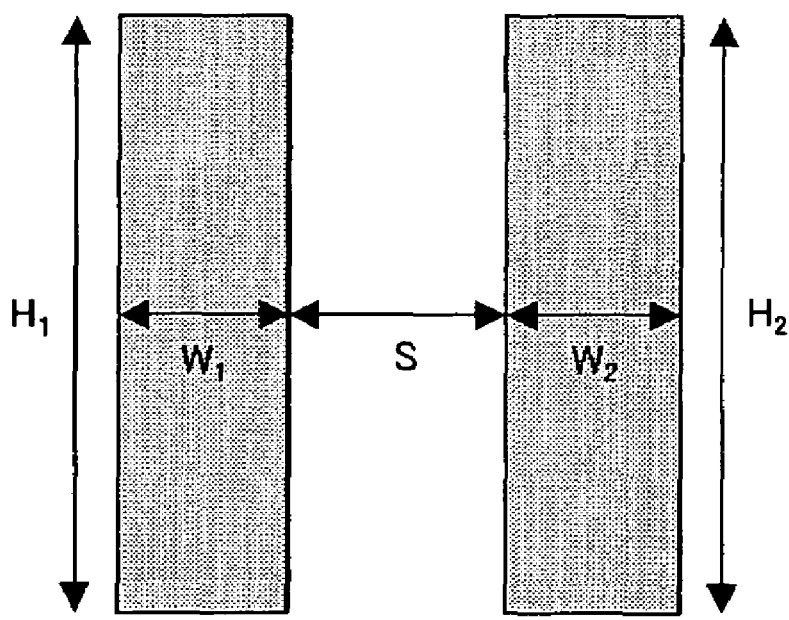
FIG. 6 is a diagram showing first adjacent patterns.

For example, because pattern a in FIG. 4 belongs to sub-region L-2-2, if the distance parameter of adjacent pattern search is assumed to be Z, the sub-region L-2-2 is vertically and horizontally extended by width Z and an expanded region 501 is created, as shown in FIG. 5. As the value of distance parameter Z, for example, the value of three times the forward-scattering length $\beta_f$ is used. Then, a sub-region including the expanded region 501 in whole or in part is extracted as a sub-region where an adjacent pattern is present. In this example, the following sub-regions are extracted:

L-type: L-1-1, L-1-2, L-1-3, L-2-1, L-2-2, L-2-3, L-3-1, L-3-2, L-3-3
H-type: H-1, H-2, H-3
V-type: V-1, V-2, V-3
A-type: A The patterns which belong to a plurality of sub-regions thus extracted are compared with the distances of each side in pattern a, and the adjacent pattern to each side is determined by selecting the pattern closest to the side.

Here, because the overlapping of forward-scatterings is problematic, width $W_1$ and height $H_1$ of a pattern itself at the position perpendicular to the side indicated by a bold line, width $W_2$ and height $H_2$ of the adjacent pattern, and distance S up to the adjacent pattern are obtained as adjacent pattern information and are stored to the memory, as shown in FIG. 6 to FIG. 9. However, in the case of FIG. 7, only the range opposite to the adjacent pattern is detached as a correction target.

When calculating the movement quantity of a side in the fourth procedure later described, forward-scattering intensity is expressed by an algebraic expression using these information. As later described, the formulas for movement quantity for two opposing sides of an adjacent pattern should be symmetrical, and therefore, it is important to obtain the size (width and height) of the other party as adjacent pattern information.

Figure 10:
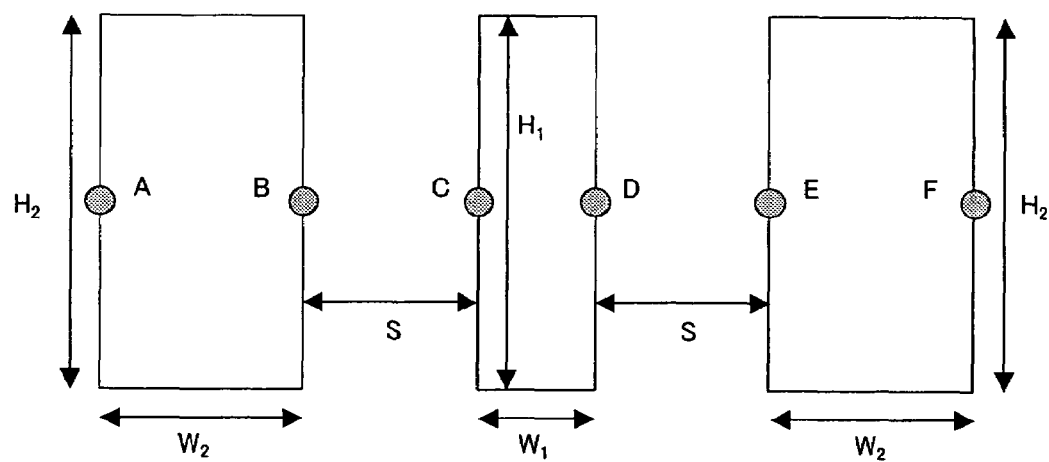
FIG. 10 is a diagram showing fifth adjacent patterns.
Figure 11:
FIG. 11 is a diagram showing adjacent pattern information.

In addition, when there are three patterns such as those shown in FIG. 10, adjacent pattern information for sides A to F is as shown in FIG. 11. In this case, since the adjacent pattern information for A and F, B and E, and C and D are the same, the information is redundant.

Consequently, adjacent pattern information is retained in another table separate from information on the sides of the pattern, and each side of the pattern only holds pointer information such as a number indicating the corresponding adjacent pattern information within the table. Because sides which have the same adjacent pattern information will hold the same pointer information, the amount of data for adjacent pattern information can be compressed, and in addition, the calculation of correction quantity under the same conditions can be omitted.

In the third procedure, the exposure data generator calculates the back-scattering intensity in each side of the non-corrected patterns. In the acceleration voltage 100 kV-exposure device, because the influence range of back-scattering reaches up to a radius of about 100 µm, it takes too much time to calculate the influence of back-scattering from individual patterns. On the other hand, if the target region is divided into meshes and back-scattering intensity is calculated by mesh units, as in the area density map method, influence from patterns in the vicinity thereof cannot be accurately calculated.

Therefore, in this embodiment, a hierarchically divided region is constructed in the memory (step 214), patterns are registered in the sub-regions in the lowest layer (step 215), and back-scattering intensity at each exposure intensity evaluation point on the patterns is calculated by using the hierarchically divided region (step 216). More specifically, the region to be processed is hierarchically divided, influences from nearby patterns are calculated precisely, and the influences from farther patterns are roughly approximated and calculated. This enables both high accuracy and high speed.

In step 214, first, the number N of layers for configuring the hierarchically divided region is determined from the number of patterns within the original region or the size of the original region. Next, with the original region as the sub-region of the first layer, each sub-region in the n-th (n=1, 2, . . . , N−1) layer is divided into a plurality of sub-regions of two or more and the (n+1)-th layer is configured.

Figure 12:
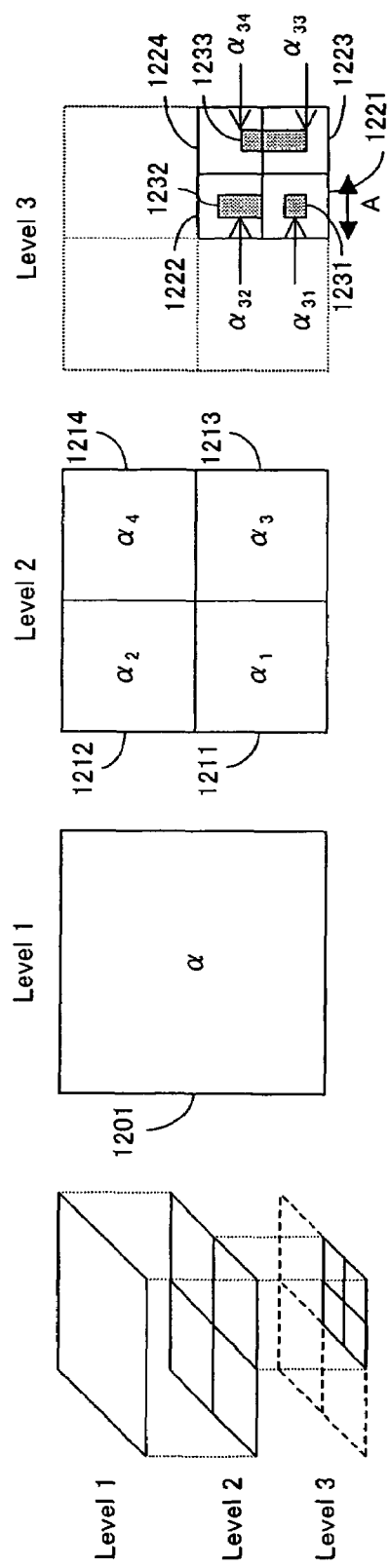
FIG. 12 is a diagram showing the hierarchical division of a region.

FIG. 12 shows the configuration of the hierarchically divided region. Sub-region 1201 in the level 1 (n=1) layer is the original region per se. In the level 2 layer, sub-region 1201 in level 1 is equally divided into 2×2 sub-regions 1211 to 1214. In the level 3 layer, each sub-region in level 2 is equally divided further into 2×2 sub-regions. This procedure is repeated to the lowest layer (N-th layer). Although the sub-regions in the lower layers are set by dividing the sub-regions in the higher layers into 2×2 sub-regions, in this example, other division methods may be used if the region can be divided into a plurality of sub-regions.

The number of layers N can be determined by estimating the average pattern number registered in each sub-region in the lowest layer from the number of patterns within the original region. For example, in order to register an average of four patterns to a sub-region of the lowest layer, a layer number table such as that shown in FIG. 13 is prepared beforehand within the memory. The value of number of layers N corresponding to the number of patterns in the original region is registered in this layer number table, and the number of layers N is automatically determined by referring thereto.

In addition, the number of layers N may be determined by estimating the size of the sub-region in the lowest layer from the size of the entire original region. For example, in order to make the size of the sub-regions in the lowest layer 0.5 μm, the number of layers N is determined by the following formula:

$$N = \left\lceil \log_2\left(\frac{\text{Length of Long Side of Original Region}}{0.5 \ \mu m}\right) \right\rceil + 1 \quad (2)$$

Here, the first term in formula (2) expresses an integer calculation (round-up).

In step 215, area density of the patterns contained in a sub-region is set in the sub-region of each layer, and each pattern is cut at the boundaries of the sub-regions in the lowest layer and registered in these sub-regions.

For example, if N=3, the three patterns, 1231 to 1233, are contained in sub-region 1213 in level 2 in FIG. 12, and these patterns are registered in sub-regions 1221 to 1224 in level 3, the lowest layer. In this case, patterns 1231 and 1232 are registered in sub-regions 1221 and 1222, respectively. On the contrary, pattern 1233 is divided into the two upper and lower sections at the boundary of sub-regions 1223 and 1224, and the upper section is registered in sub-region 1223 and the lower section, sub-region 1224.

Here, if the size of the sub-regions in level 3 is assumed to be A and the areas of each pattern registered in sub-regions 1231, 1232, 1233, and 1234 are assumed to be $S_i$, $S_j$, $S_k$, and $S_l$, respectively, the area densities $\alpha_{31}$, $\alpha_{32}$, $\alpha_{33}$ and $\alpha_{34}$ of the patterns in these sub-regions can be calculated by the following formulas:

$$\alpha_{31} = \Sigma S_i / A^2$$

$$\alpha_{32} = \Sigma S_j / A^2$$

$$\alpha_{33} = \Sigma S_k / A^2$$

$$\alpha_{34} = \Sigma S_l / A^2 \quad (3)$$

The pattern area densities $\alpha_{11}$ to $\alpha_{14}$, $\alpha_{21}$ to $\alpha_{24}$, and $\alpha_{31}$ to $\alpha_{34}$ of the other sub-regions in level 3 are also calculated similarly. The pattern area densities of the sub-regions in each layer, levels 1 and 2, are calculated as follows from the pattern area densities of the sub-regions in level 3 thus obtained:

Pattern area densities $\alpha_1$ to $\alpha_4$ of sub-regions 1211 to 1214 in level 2:

$$\alpha_1 = (\alpha_{11} + \alpha_{12} + \alpha_{13} + \alpha_{14})/4$$

$$\alpha_2 = (\alpha_{21} + \alpha_{22} + \alpha_{23} + \alpha_{24})/4$$

$$\alpha_3 = (\alpha_{31} + \alpha_{32} + \alpha_{33} + \alpha_{34})/4$$

$$\alpha_4 = (\alpha_{41} + \alpha_{42} + \alpha_{43} + \alpha_{44})/4 \quad (4)$$

Pattern area density α of sub-region 1201 in level 1:

$$\alpha = (\alpha_1 + \alpha_2 + \alpha_3 + \alpha_4)/4 \quad (5)$$

Although the patterns used in the third procedure are initially non-corrected patterns, the patterns used in the second or later process when repeating corrections are previously corrected patterns.

Figure 14:
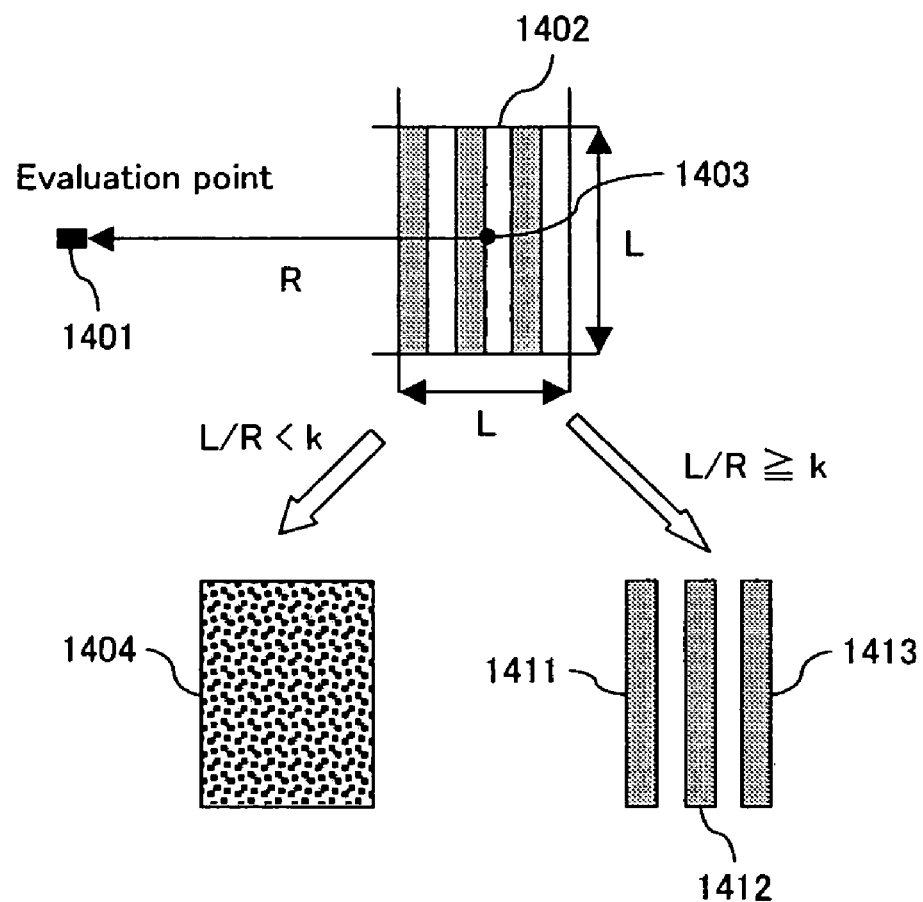
FIG. 14 is a diagram showing the approximation calculation of the back-scattering intensity.

In step 216, back-scattering intensity in each side in each pattern are calculated by using the region hierarchically divided as such. At this time, the point on the side (the midpoint of the side) of which back-scattering is to be determined is called an evaluation point. As shown in FIG. 14, following the layers starting with the sub-regions in level 1 (n=1), the ratio L/R of size L of sub-region 1402 in the n-th (n=1, 2, . . . , N) level and distance R between the evaluation point 1401 and the center 1403 of sub-region 1402 is compared with the threshold value k, and the back-scattering intensity is calculated as follows in accordance with the comparison result:

$$L/R < k \text{ (R is sufficiently large in comparison to L)} \quad (1)$$

The back-scattering intensity from the patterns within sub-region 1402 is approximated by the back-scattering intensity from rectangle 1404, which has the size L×L and the area density of sub-region 1402, and calculated.

$$L/R \geq k \quad (2)$$

The similar evaluation is conducted on sub-regions (2×2 sub-regions) in the (n+1)-th layer within sub-region 1402. If the n-th layer is the lowest layer (n=N), the back-scattering intensities from individual patterns 1411 to 1413, registered in sub-region 1402, are accurately calculated.

Because the influence of back-scattering from patterns in the vicinity of the exposure intensity evaluation point is calculated precisely and more patterns can be approximated as one rectangular pattern the farther away, wherein contribution decreases, the pattern is, by using the hierarchically divided region, the influence of back-scattering can be accurately calculated at a high speed.

FIG. 15 shows an example of the rectangular patterns used for approximation in (1), above. In this example, the evaluation point is located at the center of sub-region 1501, and the threshold value k is set to 1. Therefore, if the L/R ratio is less than 1, the patterns in each sub-region are approximated by a rectangular pattern.

In this case, although it is necessary to calculate influences from individual patterns in sub-region 1501, the influence from patterns in other sub-regions may be simply calculated by approximating patterns in each sub-region by one rectangular pattern. The final back-scattering intensity $F_b$ at the evaluation point is obtained by adding the back-scattering intensity from these patterns.

The threshold value k is variable in accordance with the spreading of the distribution function configuring the back-scattering intensity distribution, and for example, is determined by the following formula:

$$k = 0.5 + \text{back-scattering length (μm)}/50 \qquad (6)$$

In the fourth procedure, the exposure data generator calculates the movement quantity of the sides by using adjacent pattern information corresponding to each side of the non-corrected pattern obtained in step 213 and the back-scattering intensity $F_b$ calculated in step 216 (step 217).

Figure 16:
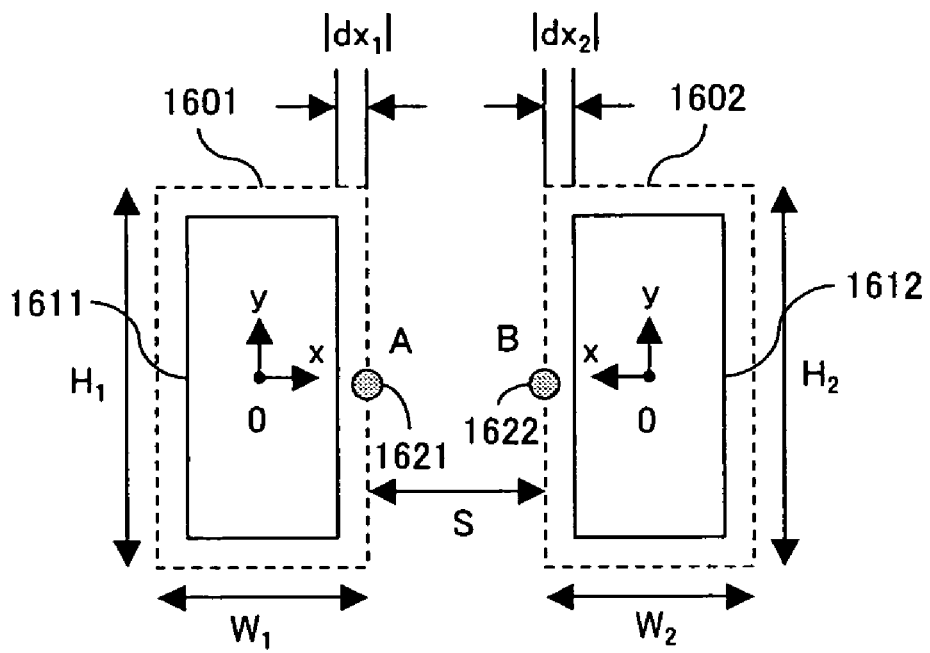
FIG. 16 is a diagram showing the movement quantity of the sides.

FIG. 16 shows the movement quantities of the sides of two adjacent non-corrected patterns. In FIG. 16, $W_1$ and $H_1$ express the width and height of pattern 1601, $W_2$ and $H_2$ express the width and height of pattern 1602, S expresses the distance between the two patterns, $dx_1$ expresses the movement quantity of side A in pattern 1601, and $dx_2$ expresses the movement quantity of side B in pattern 1602. $dx_1$ and $dx_2$ are positive values when the side is moved in a direction wherein the pattern is thickened and are negative values when it is moved in a direction wherein the pattern is thinned.

In this case, as conditional formulas with which the exposure intensity should comply, when taking into account the overlapping of forward-scatterings at evaluation point 1621 on side A and evaluation point 1622 on side B, the following simultaneous equations are obtained:

$$F_f\left(\frac{W_1}{2}, 0, W_1 + 2dx_1, H_1\right) + \qquad (7)$$
$$F_f\left(\frac{W_2}{2} + S, 0, W_2 + 2dx_2, H_2\right) + F_b = E_{th}$$

$$F_f\left(\frac{W_1}{2} + S, 0, W_1 + 2dx_1, H_1\right) + \qquad (8)$$
$$F_f\left(\frac{W_2}{2}, 0, W_2 + 2dx_2, H_2\right) + F_b = E_{th}$$

These simultaneous equations are symmetrical with respect to the movement quantity $dx_1$ of side A and the movement quantity $dx_2$ of side B. Here, $E_{th}$ is the reference exposure intensity. In addition, $F_f(x, y, W, H)$ is the function of the forward-scattering intensity, distribution at the evaluation point (x, y) when the entire rectangular pattern of width W and height H is exposed and is equivalent to a surface integral of the forward-scattering term of the afore-mentioned EID function f(x, y) within the rectangular pattern. However, it is assumed that the center O of the rectangular pattern is the origin (0,0), the horizontal direction is the x axis, the vertical direction is the y axis, and the direction towards another pattern from the center O is the positive direction of the x axis.

If a single Gaussian distribution is used wherein the forward-scattering length is $\beta_f$ as f(x, y), $F_f(x, y, W, H)$ is expressed by the following formulas:

$$F_f(x, y, W, H) = \frac{1}{4}\left[erf\left(\frac{W-2x}{2\beta_f}\right) + erf\left(\frac{W+2x}{2\beta_f}\right)\right] \qquad (9)$$
$$\left[erf\left(\frac{H-2y}{2\beta_f}\right) + erf\left(\frac{H+2y}{2\beta_f}\right)\right]$$

$$erf(x) = \frac{2}{\sqrt{\pi}} \int_0^x \exp(-t^2) dt \qquad (10)$$

Of course, multi-Gaussian distribution may be used as f(x, y), and a surface integral of distribution other than Gaussian distribution within the rectangular pattern may be used as $F_f(x, y, W, H)$.

For example, if each side of pattern 1601 is moved inwardly by |$dx_1$|, pattern 1611 is obtained, and if each side of pattern 1602 is moved inwardly by |$dx_2$|, pattern 1612 is obtained. The width and height of pattern 1611 are $W_1+2dx_1$ and $H_1+2dx_1$. However, because it is assumed here that the height is sufficiently longer than the width and the change in height can be ignored, $H_1$ is used as the height of pattern 1611. For similar reasons, $H_2$ is used as the height of pattern 1612.

The coordinates of evaluation point 1621 are ($W_1/2$, 0) in the coordinate system of pattern 1601 and are ($W_2/2+S$, 0) in the coordinate system of pattern 1602. Therefore, the condition regarding exposure intensity at evaluation point 1621 is expressed by formula (7), above. On the other hand, the coordinates of evaluation point 1622 are ($W_1/2+S$, 0) in the coordinate system of pattern 1601 and are ($W_2/2$, 0) in the coordinate system of pattern 1602. Therefore, the condition regarding exposure intensity at evaluation point 1622 is expressed by formula (8), above.

The subroutine of movement quantity calculation processing for determining $dx_1$ as the solution of these simultaneous equations is incorporated into the program for exposure data correction processing in advance. The exposure data generator calculates the movement quantity $dx_1$ required to change the exposure intensity at the evaluation point to $E_{th}$ from $W_1$, $H_1$, $W_2$, $H_2$, S, $F_b$ and $E_{th}$ by executing this sub-routine. The details of this movement quantity calculation processing are described later.

If distance S between the evaluation point and another pattern is long enough so overlapping of forward-scatterings does not exist, the movement quantity $dx_1$ can be calculated based on the following formula which does not take into account another pattern, in place of the afore-mentioned simultaneous equations.

$$F_f\left(\frac{W_1}{2}, 0, W_1 + 2dx_1, H_1\right) + F_b = E_{th} \qquad (11)$$

Figure 7:
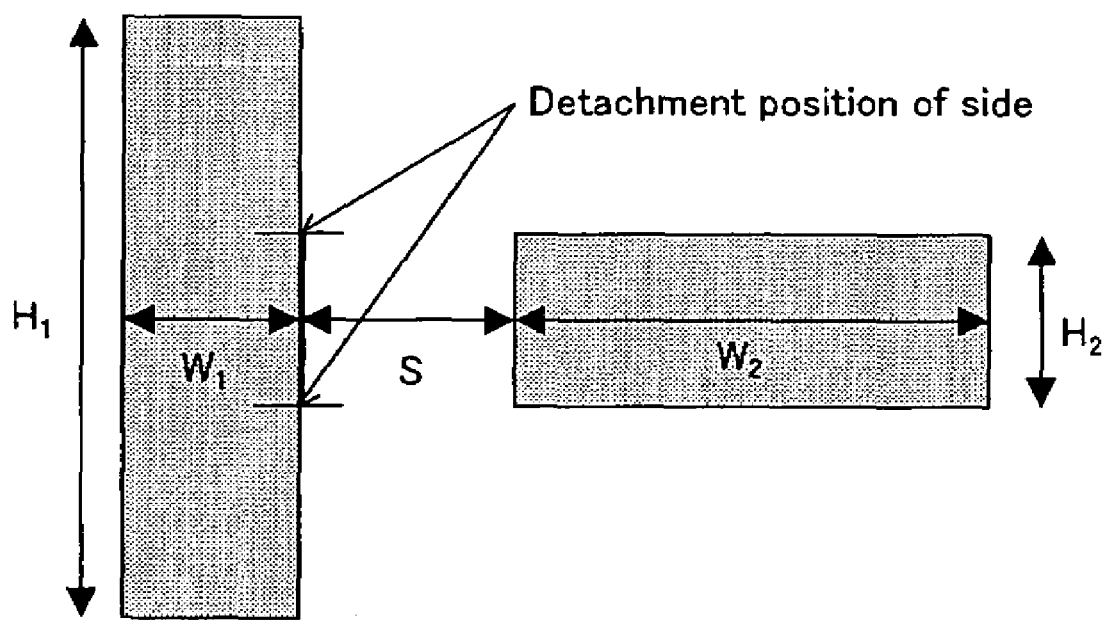
FIG. 7 is a diagram showing second adjacent patterns.
Figure 9:
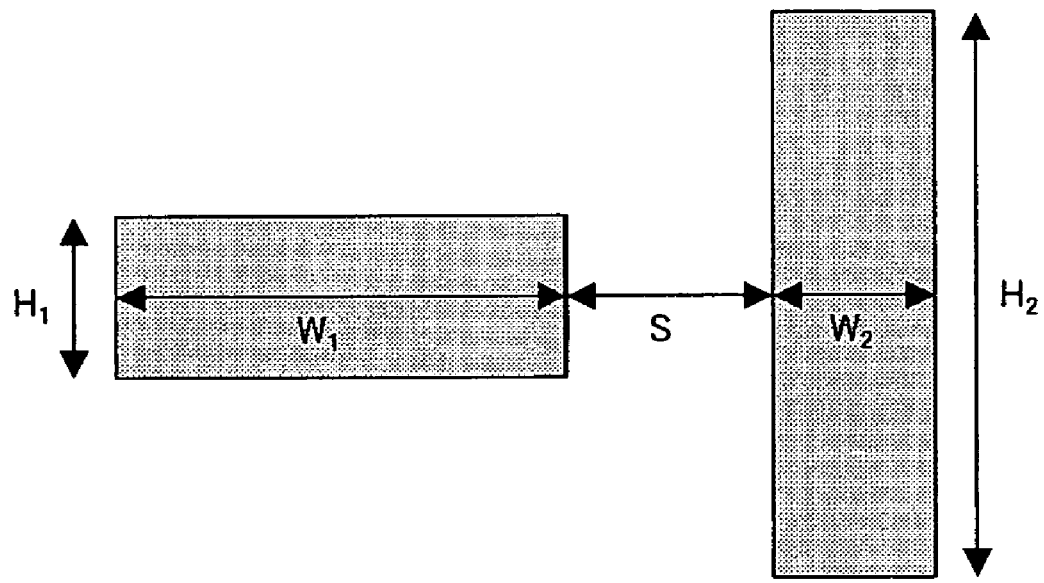
FIG. 9 is a diagram showing fourth adjacent patterns.

In addition, as shown in FIG. 7 to FIG. 9, if one of the sides of two adjacent patterns is the tip of a thin pattern, namely, if $H_1$ or $H_2$ is smaller than the influence range of forward-scattering, the forward-scattering intensity distribution varies with the correction processing for the lateral side (in the horizontal direction) of the pattern. Therefore, the size of $H_1$ or $H_2$ is replaced with the size after correction, beforehand.

In addition, calculation under the same conditions can be omitted by adding the calculation result of the movement quantity of the side to adjacent pattern information as history information.

After calculating the movement quantities of all sides of the pattern by the afore-mentioned sub-routine, the exposure data generator changes the shape of the pattern by actually moving the sides (step 218). In this case, because back-scattering intensity distribution to the surrounding area is changed by changing the pattern shape, the final corrected data 202 is generated by repeatedly executing the third and fourth procedures. The third and fourth procedures may be repeated a predetermined number of times, or they may be repeated until an instruction from the user is input.

Next, described are the specific examples of the movement quantity calculation processing in step 217 in FIG. 2 with reference to FIG. 17 to FIG. 21.

Figure 17:
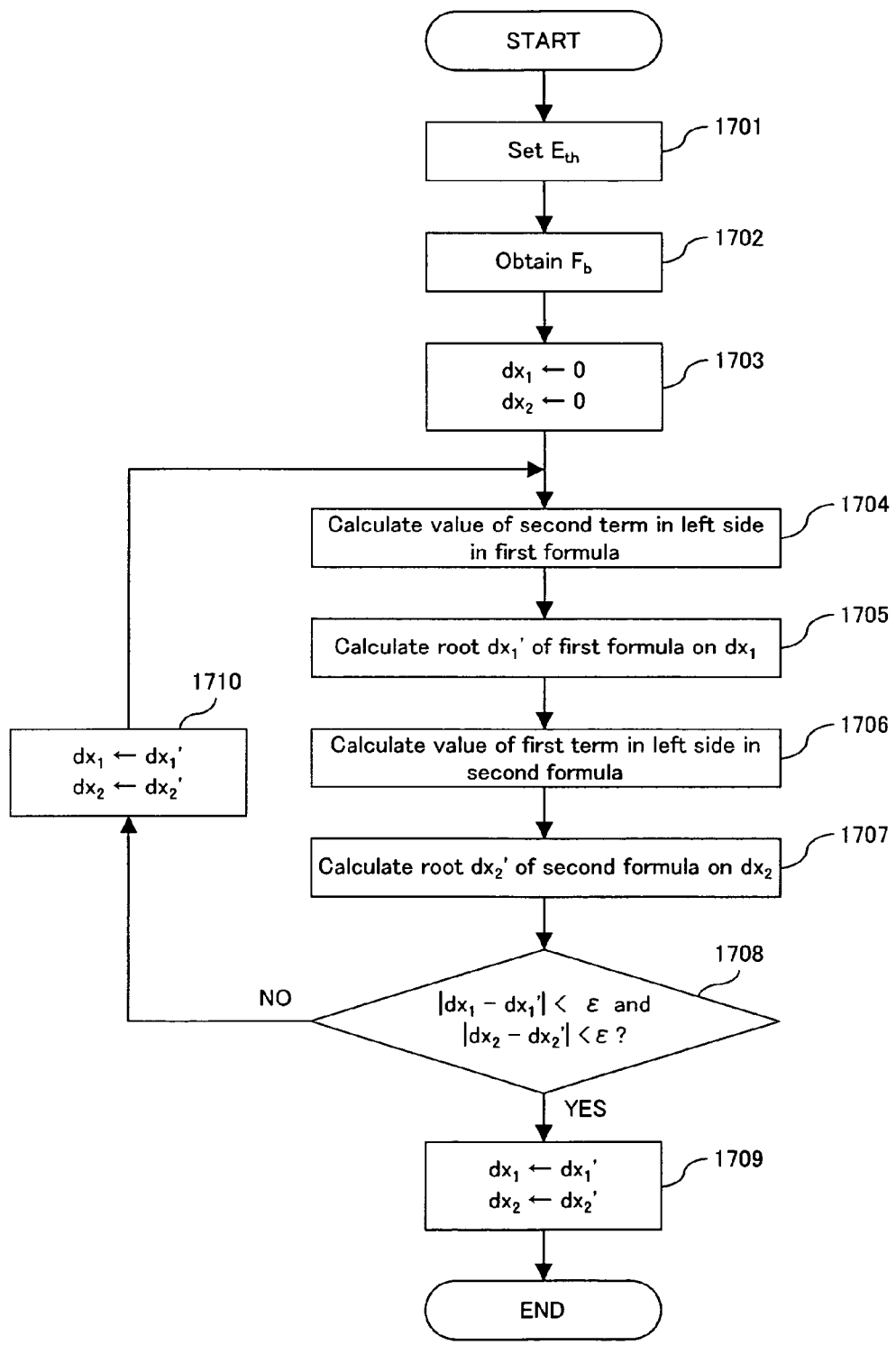
FIG. 17 is a flowchart of the movement quantity calculation processing.

FIG. 17 is a flowchart of the movement quantity calculation processing. In FIG. 17, first and second formulas indicate the afore-mentioned formulas (7) and (8), respectively.

When the sub-routine is started, the exposure data generator first sets the value of $E_{th}$ (step 1701), obtains back-scattering intensity $F_b$ calculated in step 216 (step 1702), and sets $dx_1$ and $dx_2$ to the initial value 0 (step 1703).

Next, the generator calculates the value of the second term on the left side in formula (7) (step 1704), and calculates the root $dx_1'$ of formula (7) on $dx_1$ (step 1705). For example, Newton-Raphson method or Wijingaarden-Dekker-Brent method is used to calculate the root. The former is a calculation method using a differential of a function, and the latter is a calculation method that dispenses with a differential of a function.

Next, the generator calculates the value of the first term on the left side of formula (8) (step 1706), and calculates the root $dx_2'$ of formula (8) on $dx_2$ (step 1707), as in step 1705. Then, the generator checks whether or not the following conditions are met (step 1708).

$$|dx_1 - dx_1'| < \epsilon \text{ and } |dx_2 - dx_2'| < \epsilon \tag{12}$$

Here, $\epsilon$ is a constant indicating calculation accuracy, and for example, one fourth of the grid size of the pattern design data is used as $\epsilon$.

If the conditions of formula (12) are not met, processing in step 1704 and later is repeated using the values of $dx_1'$ and $dx_2'$ as $dx_1$ and $dx_2$ (step 1710), respectively. If the conditions of formula (12) are met in step 1708, the values of $dx_1'$ and $dx_2'$ are stored respectively as the calculation results of $dx_1$ and $dx_2$ (step 1709) and the processing is terminated.

Figure 18:
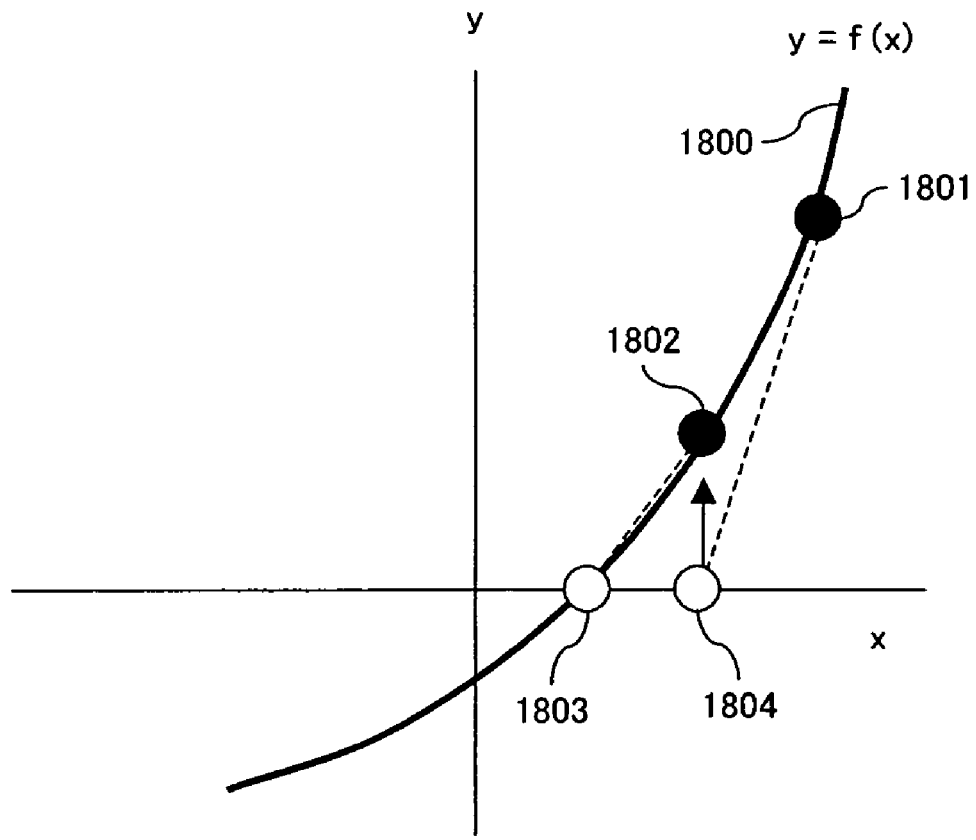
FIG. 18 is a diagram showing a first root calculation method.

FIG. 18 shows the calculation of the root by the afore-mentioned Newton-Raphson method. For example, if determining the root $dx_1$ of formula (7), the processing for determining $x_{i+1}$ from the current value of $x_i$ by using the function $f(x)$ of the following formula is repeated.

$$f(x) = F_f\left(\frac{W_1}{2}, 0, W_1 + 2x, H_1\right) + F_f\left(\frac{W_2}{2} + S, 0, W_2 + 2dx_2, H_2\right) + F_b - E_{th} \tag{13}$$

For example, if the x coordinate at point 1801 on curve 1800, expressed by y=f(x), is assumed to be the current value, the value of y coordinate is determined from this value by using formula (13), and next, value of x coordinate 1804 at point 1802 is determined from the value of y coordinate at point 1801 and the value of derivative f'(x) of f(x). The value of x coordinate at point 1802 corresponding to y=0 can be determined numerically by repeating such calculations. The same processing is also executed to determine root $dx_2'$ of formula (8).

Figure 19:
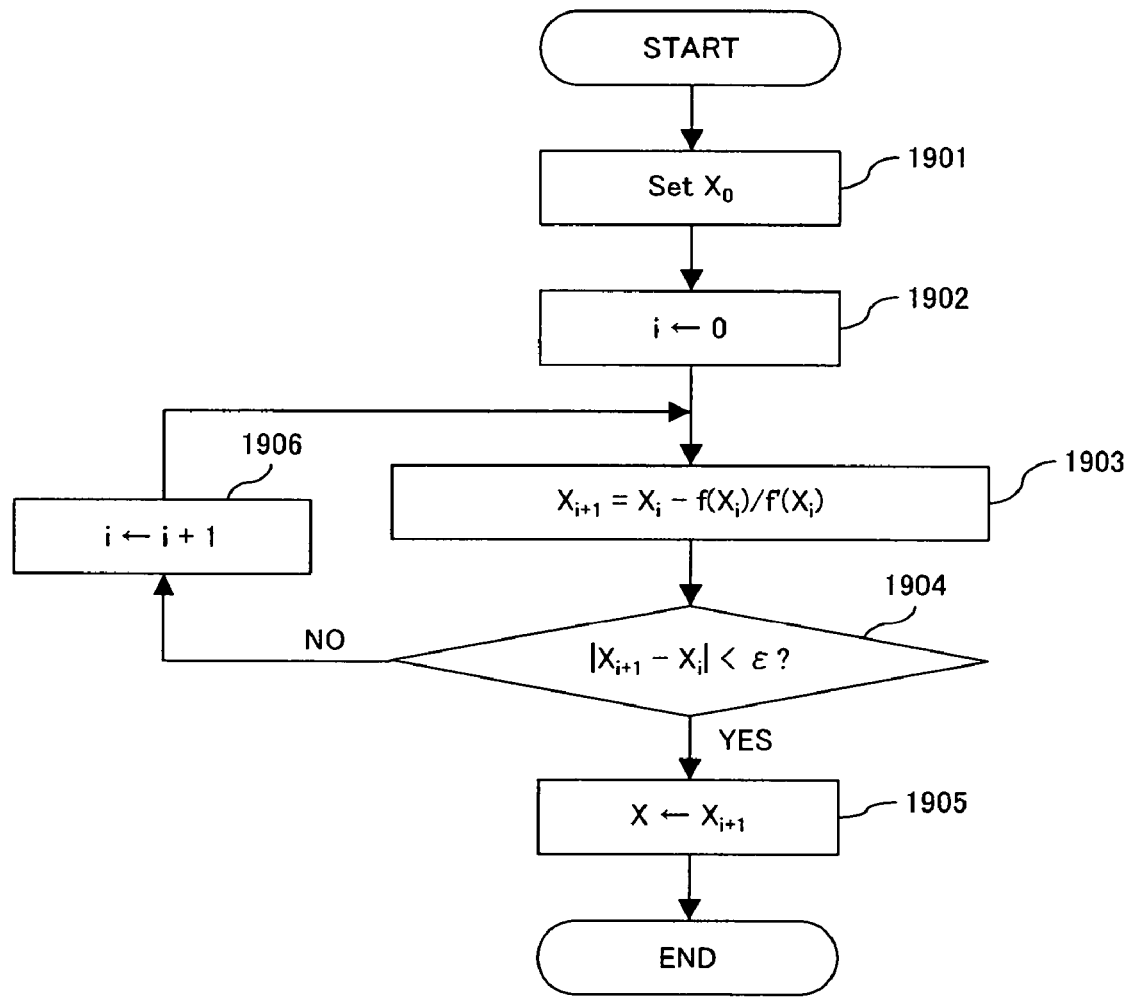
FIG. 19 is a flowchart showing a first root calculation processing.

FIG. 19 is the flowchart of a root calculation processing such as this. The exposure data generator first sets the value of $X_0$ (step 1901), sets the control variable i to 0 (step 1902), and calculates $x_{i+1}$ by the following formula (step 1903):

$$x_{i+1} = x_i - f(x_i)/f'(x_i) \tag{14}$$

Then, the generator checks whether or not the following condition is established (step 1904) by using the afore-mentioned calculation accuracy $\epsilon$.

$$|x_{i+1} - x_i| < \epsilon \tag{15}$$

If the condition of formula (15) is not established, the value of i is incremented by 1 (step 1906), and the processing in step 1903 and later is repeated. If the condition of formula (15) is established in step 1904, the value of $x_{i+1}$ is stored as the calculation result of root x (step 1905) and the processing is terminated. The value of x thus obtained is used as $dx_1'$ or $dx_2'$.

Figure 20:
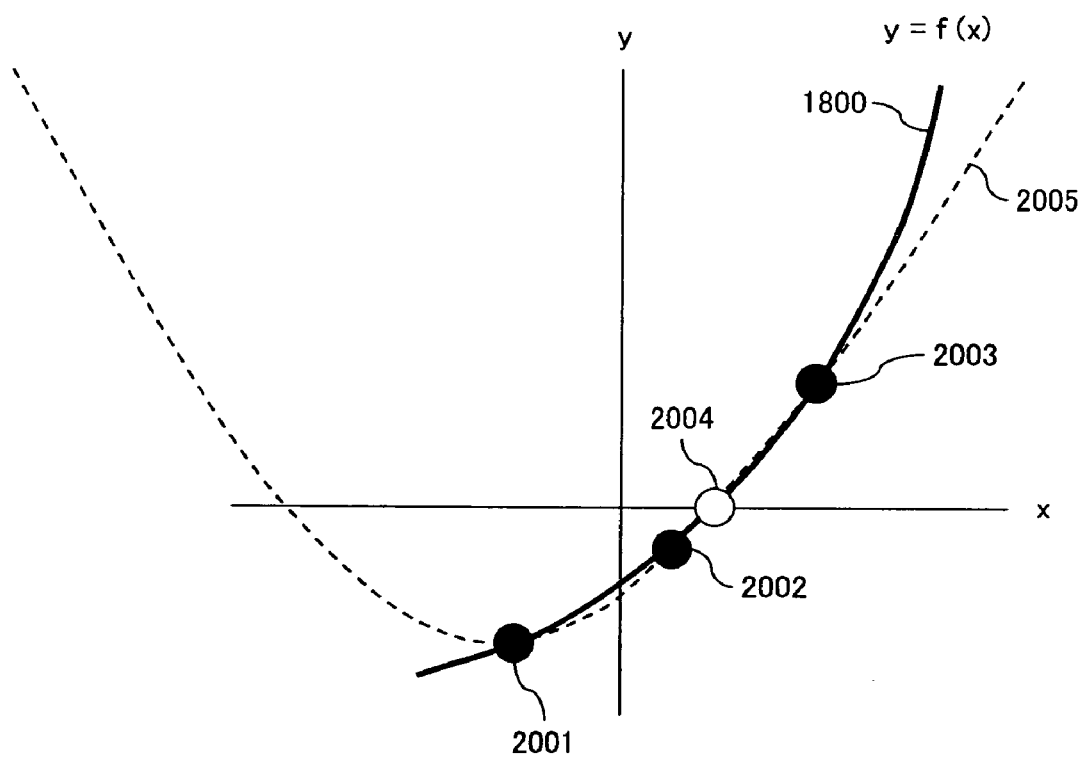
FIG. 20 is a diagram showing a second root calculation method.

FIG. 20 shows the calculation of the root by the afore-mentioned Wijingaarden-Dekker-Brent method. Function f(x) is defined as in Newton-Raphson method in this case, as well. Here, if the coordinate values at points 2001, 2002, and 2003 are assumed to be (a, f(a)), (b, f(b)) and (c, f(c)), curve 2005 of the inverse quadric (x is the quadric of y) which passes through these three points is expressed by the following formula:

$$x = \frac{[y-f(a)][y-f(b)]c}{[f(c)-f(a)][f(c)-f(b)]} + \frac{[y-f(b)][y-f(c)]a}{[f(a)-f(b)][f(a)-f(c)]} + \frac{[y-f(c)][y-f(a)]b}{[f(b)-f(c)][f(b)-f(a)]} \tag{16}$$

In this case, the value of x coordinate at point 2004 corresponding to y=0 on curve 2005 is determined by assigning y=0 to formula (16). The value of x coordinate is used as the estimated value of the root of f(x). However, the afore-mentioned three points are selected so as to meet the following conditions.

$$f(b)f(c) < 0 \text{ and } |f(b)| < |f(c)| \tag{17}$$

Selecting the three points like this, an improved value can be found by formula (16) with b, which is the value of x coordinate at point 2002, as the initial estimated value.

Figure 21:
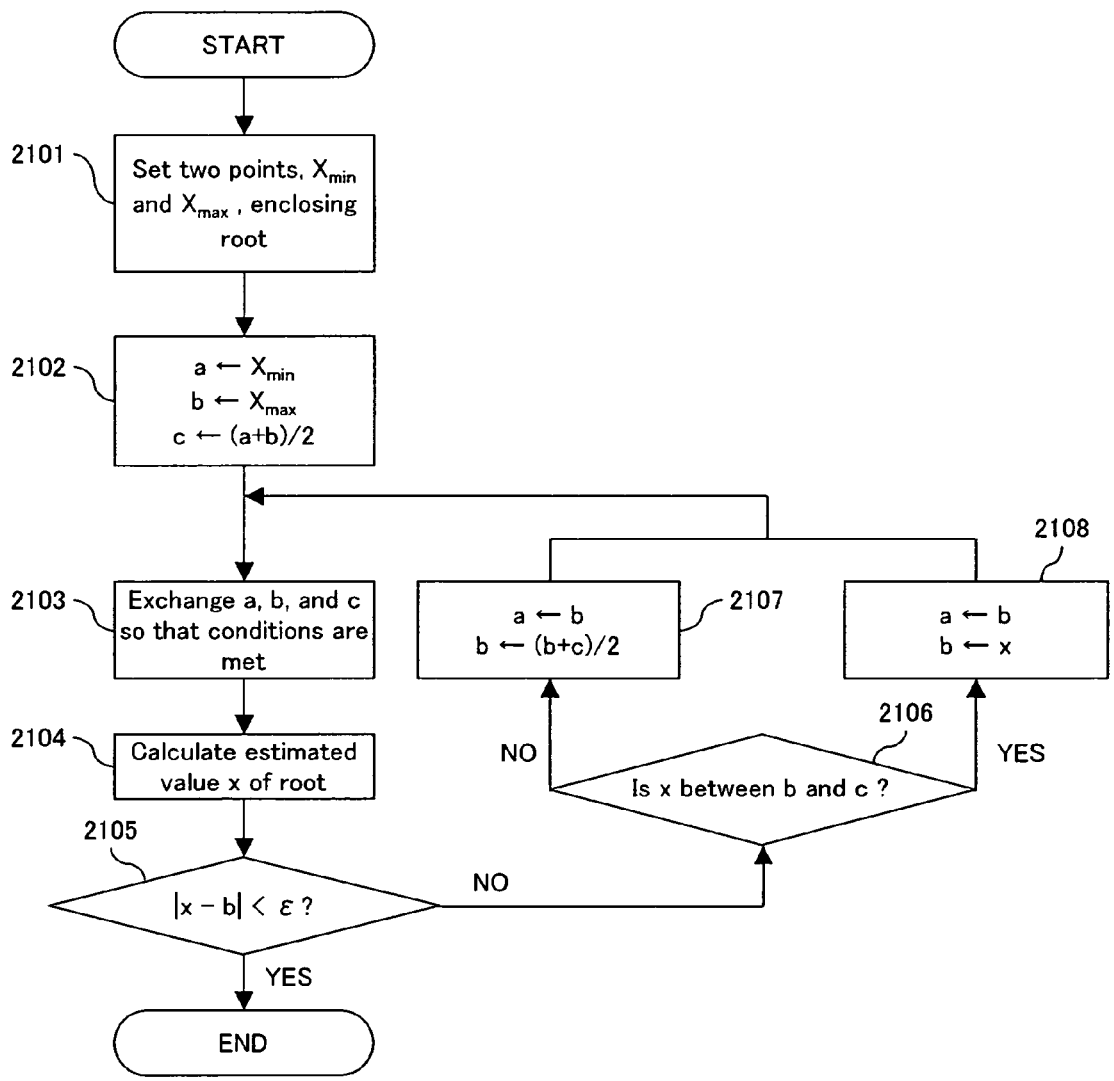
FIG. 21 is a flowchart of a second root calculation processing.

FIG. 21 is a flowchart of a root calculation processing such as this. The exposure data generator first sets the values of two points, $x_{min}$ and $x_{max}$, which enclose the root (step 2101), respectively sets variables a and b to the values of $x_{min}$ and $x_{max}$, sets variable c to the value of (a+b)/2 (step 2102), and exchanges the values of a, b, and c so as to satisfy formula (17) (2103).

Then, the generator calculates the estimated value x of the root by formula (16) (step 2104), and checks whether or not the following condition is met by using the afore-mentioned calculation accuracy $\epsilon$ (step 2105).

$$|x - b| < \epsilon \tag{18}$$

If the condition of formula (18) is not met, the generator then checks whether or not x is present between b and c (step 2106). If x is not present between b and c, a is changed to the value of b, b is changed to the value of (b+c)/2 (step 2107), and the processing in step 2103 and later is repeated. On the other hand, if x is present between b and c, the generator changes a to the value of b and b to the value of x (step 2108), and the processing in step 2103 and later is repeated.

Then, if the condition of formula (18) is met in step 2105, the processing is terminated. The value of x thus obtained is used as $dx_1'$ or $dx_2'$.

Incidentally, although only pattern area density is set in each sub-region of each level in step 215 in FIG. 2, the information to be set may be that which can approximately express the feature of patterns within a sub-region. For example, the information on the centroid of the patterns within a sub-region can be also set, in addition to pattern area density.

Figure 22:
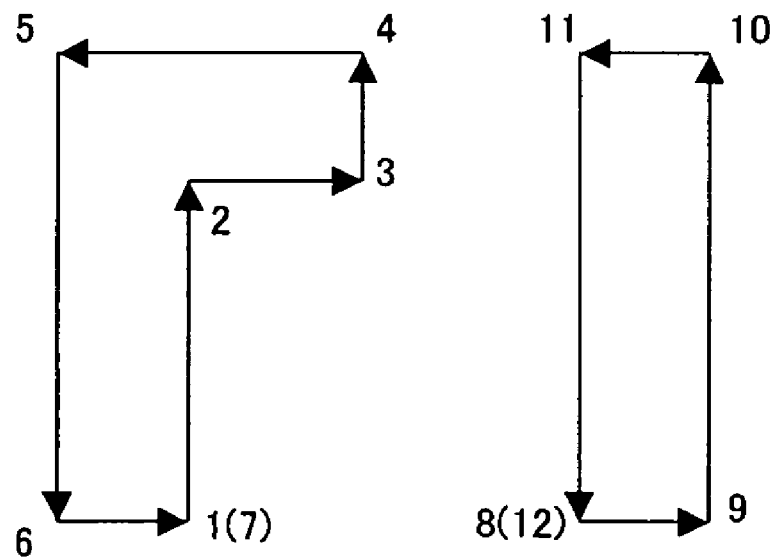
FIG. 22 is a diagram showing the numbering of the vertices of a pattern group.

In this case, as shown in FIG. 22, first, the vertices of all patterns within a sub-region are numbered counterclockwise (the direction wherein the interior of the pattern is to the left). In this case, the starting point and ending point of each pattern are determined to be the same vertex. And, the coordinates of the centroid of the patterns are determined by the following formula, with the coordinates of the i-th vertex as $(x_i, y_i)$ $$x_G = \frac{\frac{1}{6}\sum_{i=1}^{n-1}(x_i y_{i+1} - x_{i+1} y_i)(x_i + x_{i+1})}{\frac{1}{2}\sum_{i=1}^{n-1}(x_i y_{i+1} - x_{i+1} y_i)} \qquad (19)$$

$$y_G = \frac{\frac{1}{6}\sum_{i=1}^{n-1}(x_i y_{i+1} - x_{i+1} y_i)(y_i + y_{i+1})}{\frac{1}{2}\sum_{i=1}^{n-1}(x_i y_{i+1} - x_{i+1} y_i)} \qquad (20)$$

Formulas (19) and (20) show the weight averaged results of the coordinate values of the centroid of the triangle formed by the origin and each side of each pattern using an area with a sign.

Figure 23:
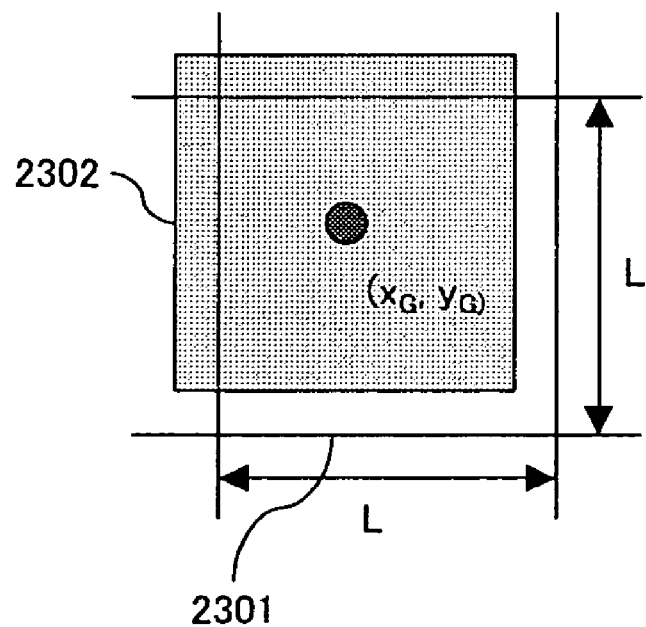
FIG. 23 is a diagram showing the centroid of the pattern group.

Next, as shown in FIG. 23, these patterns are approximated by a rectangle of which the size is the same as that of the sub-region 2301, L×L, the center is $(x_G, y_G)$, and the area density is α. α is determined by the following formula:

$$\alpha = \frac{\frac{1}{2}\sum_{i=1}^{n-1}(x_i y_{i+1} - x_{i+1} y_i)}{L^2} \qquad (21)$$

In the foregoing embodiment, back-scattering intensity is handled as a fixed value when calculating the movement quantity of the side, and changes in the back-scattering intensity due to movement is reflected in the processing result by repeating corrections. However, if a distribution function with a relatively narrow spreading is present among the distribution functions configuring the back-scattering intensity distribution, the efficiency can be improved by taking into account the changes in back-scattering due to changes in the movement quantity of the side when calculating the movement quantity of the side.

In this case, in the fourth procedure in FIG. 2, the previous movement quantity of the side is stored to the memory, and only the difference between the previous and current movement quantity of the side is subtracted from or added to the influence of back-scattering. Namely, addition is employed when the side is moved in a direction wherein the pattern is thickened in comparison with the previous time, and subtraction when the side is moved in a direction wherein the pattern is thinned. Therefore, the afore-mentioned formulas (7) and (8) can be rewritten into the following formulas:

$$F_f\!\left(\frac{W_1}{2}, 0, W_1 + 2dx_1, H_1\right) + \qquad (22)$$
$$F_f\!\left(\frac{W_2}{2} + S, 0, W_2 + 2dx_2, H_2\right) + \Delta_b(dx_1^P, dx_1, H_1) + F_b = E_{th}$$

-continued $$F_f\!\left(\frac{W_1}{2} + S, 0, W_1 + 2dx_1, H_1\right) + \qquad (23)$$
$$F_f\!\left(\frac{W_2}{2}, 0, W_2 + 2dx_2, H_2\right) + \Delta_b(dx_2^P, dx_2, H_2) + F_b = E_{th}$$

Here, $dx_1$ and $dx_2$ represent the current movement quantities of the side, and $dx_1^P$ and $dx_2^P$ represent the previous movement quantities of the side. In addition, $\Delta_b$ is a function such as the following formula showing the change of the back-scattering intensity:

$$\Delta_b(dx_j^P, dx_j, L) = F_b\!\left(\frac{dx_j + dx_j^P}{2}, 0, dx_j - dx_j^P, L\right), \quad j=1, 2 \qquad (24)$$

However, L represents the length of the side containing the evaluation point. $F_b(x, y, W, H)$ is the function of the back-scattering intensity distribution at the evaluation point $(x, y)$ when the entire rectangular pattern, the width of which is W and the height of which is H, is exposed, and is equivalent to the surface integral of the back-scattering term of the afore-mentioned EID function f(x, y) within the rectangular pattern. If the single Gaussian distribution with back-scattering length of $\beta_b$ is used as f(x, y), $F_b(x, y, W, H)$ is expressed by the following formula:

$$F_b(x, y, W, H) = \qquad (25)$$
$$\frac{\eta}{4}\!\left[\text{erf}\!\left(\frac{W-2x}{2\beta_b}\right) + \text{erf}\!\left(\frac{W+2x}{2\beta_b}\right)\right]\!\left[\text{erf}\!\left(\frac{H-2y}{2\beta_b}\right) + \text{erf}\!\left(\frac{H+2y}{2\beta_b}\right)\right]$$

The sign of the function $\Delta_b(dx_j^P, dx_j, L)$ is positive and negative, respectively if $dx_j > dx_j^P$ and if $dx_j < dx_j^P$, and $\Delta_b(dx_j^P, dx_j, L) = 0$ if $dx_j = dx_j^P$.

Meanwhile, if the spreading of all distribution functions configuring the exposure intensity distribution is wider than the distance to the adjacent pattern, particular treatment of forward-scattering is unnecessary, and the first and second procedures in FIG. 2 can be omitted. In this case, the flowchart of the exposure data correction processing is as shown in FIG. 24.

Figure 24:
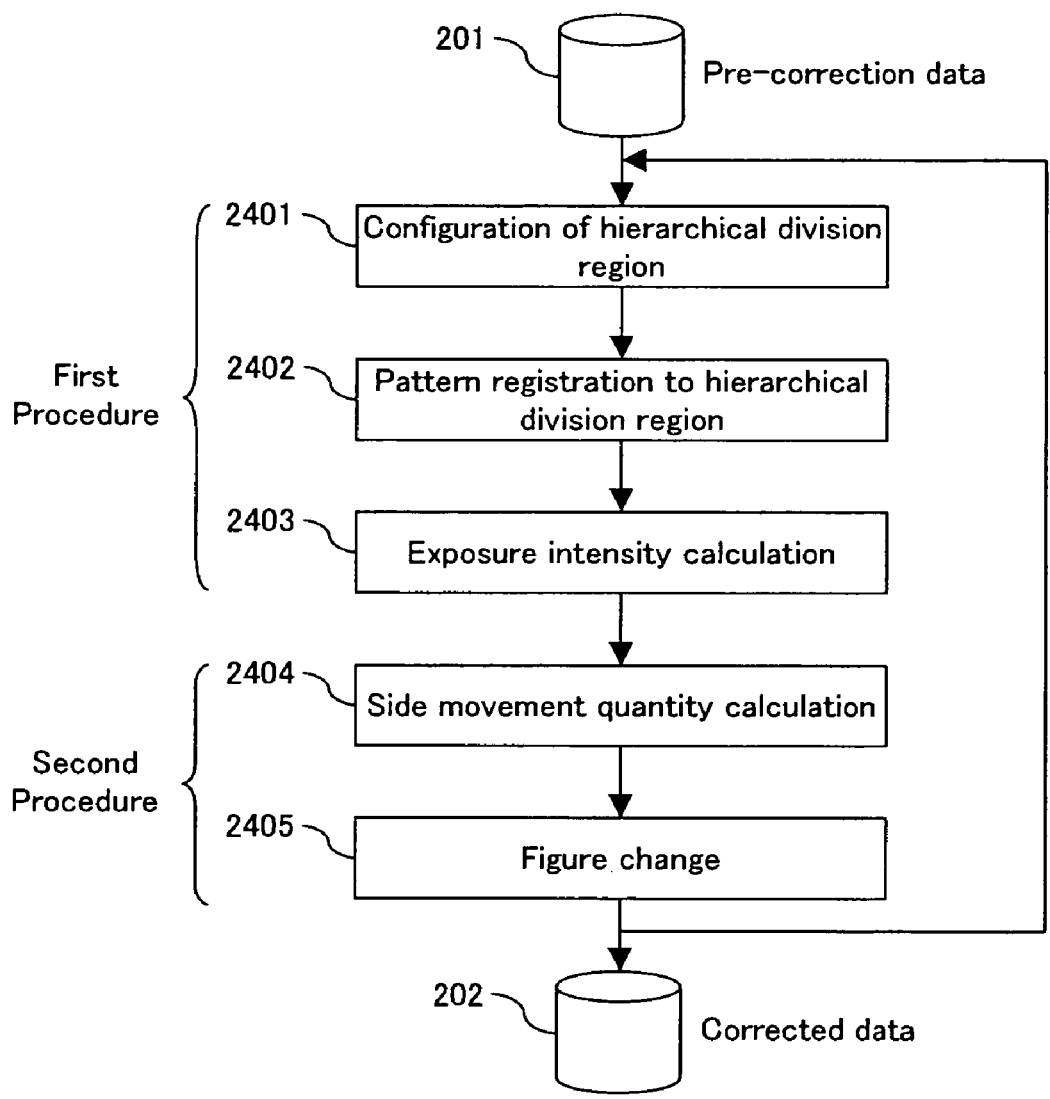
FIG. 24 is a flowchart of a second exposure data correction processing.

Out of the first procedure in FIG. 24, the processing in steps 2401 and 2402 are the same as the processing in steps 214 and 215 in FIG. 2. However, step 2403 differs from step 216 in FIG. 2 in that exposure intensity is calculated in both back-scattering and forward-scattering.

In this exposure intensity calculation processing, the exposure data generator determines the sum of the forward-scattering intensity and the back-scattering intensity at an evaluation point on each side of each pattern as the exposure intensity, by using the hierarchically divided regions. In this case, the ratio L/R of size L of the sub-region in the n-th level and distance R between the evaluation point and the center of the sub-region is compared with the threshold value k, and the exposure intensity is calculated as follows in response to the comparison result:

$$L/R < k \qquad (1)$$

The forward-scattering intensity and the back-scattering intensity from the patterns within the sub-region are approximately calculated by the area density map method.

$$L/R \geq k \qquad (2)$$

Sub-regions in the (n+1)-th level within the sub-region are evaluated. If the n-th level is the lowest layer, forward-scattering intensity and back-scattering intensity are accurately calculated from individual patterns registered in the sub-region.

Because the degree of approximation varies according to the value of L/R in this calculation method, as opposed to a simple area density map method, calculation can be performed accurately even in narrow spreading such as forward-scattering.

Next, in the second procedure, the movement quantity dx of the side is calculated based on the following formula (step 2404), and the shape of the pattern is changed by moving the side (step 2405).

$$\Delta(dx_j^P, dx_j, L) + E = E_{th}, j=1,2 \quad (26)$$

Here, E is the exposure intensity obtained in step 2403. In addition, Δ is a function such as the following formula which shows the change of exposure intensity due to the change in movement quantity of the side from $dx_j^P$ to $dx_j$.

$$\Delta(dx_j^P, dx_j, L) = F_f\left(\frac{dx_j + dx_j^P}{2}, 0, dx_j - dx_j^P, L\right) + \quad (27)$$

$$F_b\left(\frac{dx_j + dx_j^P}{2}, 0, dx_j - dx_j^P, L\right), \quad j = 1, 2$$

Although it is assumed that the spreading of all distribution functions configuring the exposure intensity distribution is wider than the distance to the adjacent pattern in this calculation method, this method is, in principle, applicable even if a distribution function with spreading equal to or less than the distance to the adjacent pattern is included. However, because the change in influence from the adjacent pattern is not accounted for at the time of calculation of the movement quantity of the side, there are more repetitious corrections compared with the processing in FIG. 2.

Although the midpoint of each side of a pattern is used as an evaluation point in the fore-going embodiment, the evaluation point may be set at other positions on the pattern.

Figure 25:
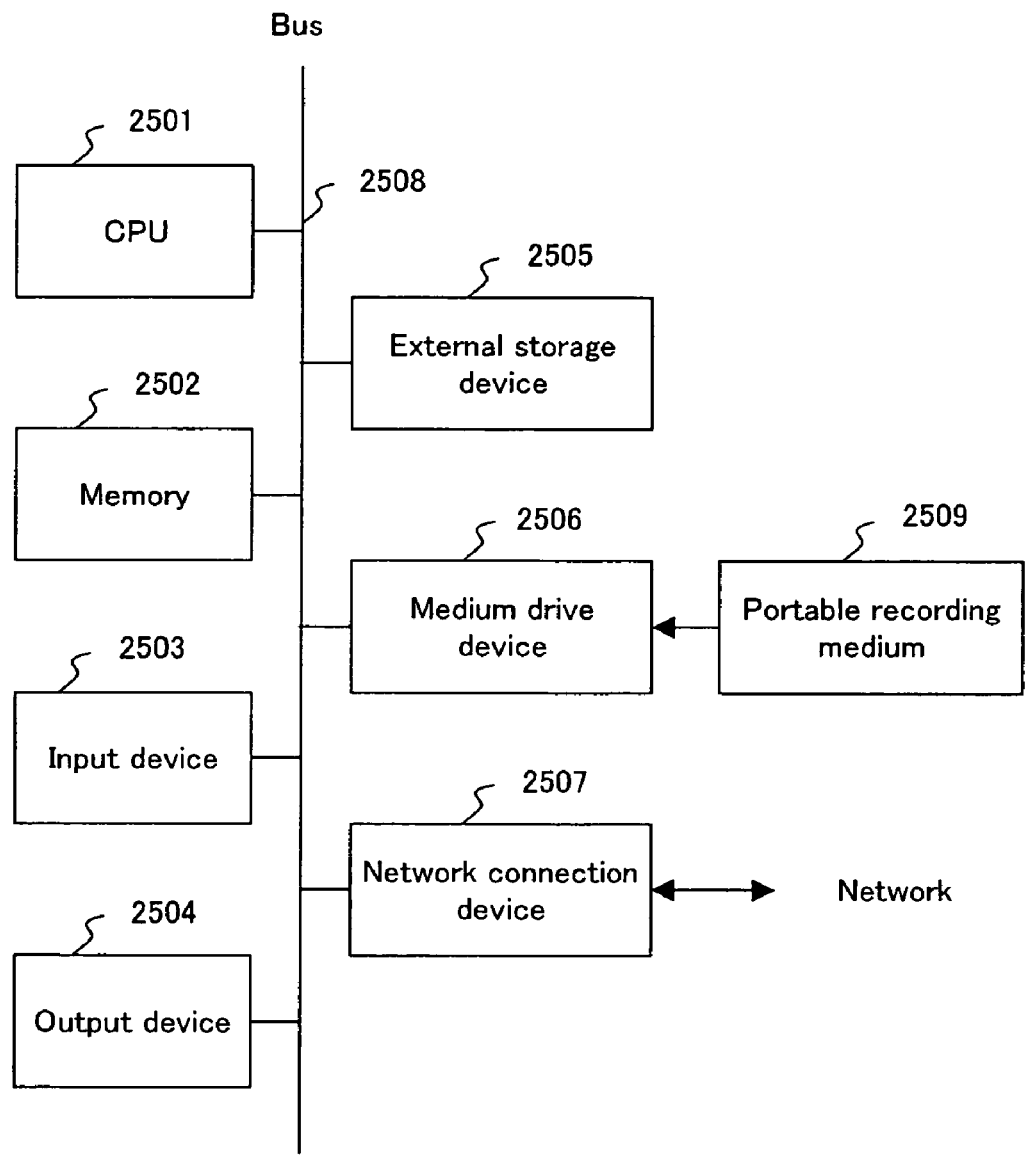
FIG. 25 is a block diagram of an information processing apparatus.

The exposure data generator according to the embodiment is constructed by using, for example, an information processing apparatus (computer) such as that shown in FIG. 25. The information processing apparatus in FIG. 25 comprises a CPU 2501, a memory 2502, an input device 2503, an output device 2504, an external storage device 2505, a medium drive device 2506, and a network connection device 2507, which are inter-connected by bus 2508.

The memory 2502 contains, for example, read only memory (ROM), random access memory (RAM) or the like, and stores a program and data used for processing. The CPU 2501 performs the exposure data correction processing by executing the program using the memory 2505. Non-corrected data 201 in FIG. 2 is read onto the memory 2505 beforehand, as the data to be processed.

The input device 2503 is used, for example, to input information and instructions from the user. The output device 2504 is, for example, a display, a printer, a speaker or the like, and is used to output processing results, inquiry or the like to the user.

The external storage device 2505 is, for example, a magnetic disk device, an optical disk device, a magneto-optical disk device, a tape device or the like. The information processing apparatus stores the program and data in the external storage device 2505 and loads them to the memory 2502 as required.

The medium derive device 2506 drives the portable recording medium 2509 to access recorded contents. The portable recording medium 2509 is an arbitrary computer-readable recording medium such as a memory card, a flexible disk, an optical disk, and a magneto-optical disk. The user stores the program and data to the portable recording medium and loads them to the memory 2502 as required.

The network connection device 2507 is connected to an arbitrary communication network such as a local area network (LAN) to perform data conversion accompanying communication. The information processing apparatus receives the program and data from an external device through the network connection device 2507 and loads them to the memory 2502 as required.

Figure 26:
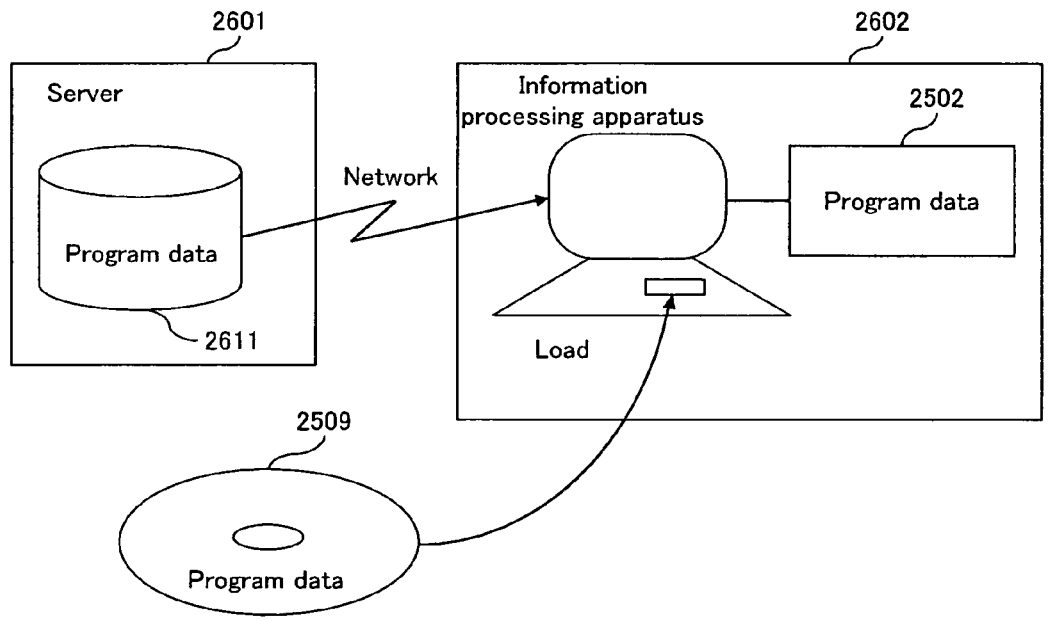
FIG. 26 is diagram showing a method for providing program and data.

FIG. 26 shows a method for providing the information processing apparatus in FIG. 25 with the program and data. The program and data stored in the portable recording medium 2509 and a database 2611 of a server 2601 are loaded to the memory 2502 of the information processing apparatus 2602. The server 2601 generates a propagation signal which propagates the program and data and transmits them to the information processing apparatus 2602 through an arbitrary transmission medium on the network. The CPU 2501 executes the program by using the data and performs the required processing.

What is claimed is:

1. A computer-readable recording medium, wherein a program which is executed by a computer for generating an exposure data representing graphic information of a pattern to be exposed comprising a plurality of sides is recorded, wherein the program enables the computer to perform:

storing pre-correction exposure data which includes information on positions and sizes of a plurality of patterns placed within a target region to a storage device;

hierarchically dividing the target region so that each sub-region in an n-th layer is divided into a plurality of sub-regions in an (n+1)-th layer with the target region as a first sub-region in a first layer and storing information on a second sub-region in each layer and information on a pattern contained within each sub-region in the lowest layer to the storage device;

obtaining a first back-scattering intensity from the plurality of patterns at an evaluation point on a first pattern by calculating a second back-scattering intensity from a second pattern which is relatively distant from the evaluation point with a third back-scattering intensity from a third sub-region in a relatively higher layer which contains the second pattern, and calculating a fourth back-scattering intensity from a third pattern which is relatively closer to the evaluation point with a fifth back-scattering intensity from a fourth sub-region in a relatively lower layer which contains the third pattern;

calculating a movement quantity of the side of the first pattern when the side is moved so that a sum of a forward-scattering intensity at the evaluation point and a sixth back-scattering intensity from the plurality of patterns becomes a reference exposure intensity; and moving the side of the first pattern by the obtained movement quantity and correcting information on the first pattern.

* * * * *